US010261392B2

(12) United States Patent
Bolis

(10) Patent No.: US 10,261,392 B2
(45) Date of Patent: Apr. 16, 2019

(54) AUTOFOCUS CAMERA AND OPTICAL DEVICE WITH VARIABLE FOCAL LENGTH INTENDED TO BE INTEGRATED INTO SUCH A CAMERA

(71) Applicant: Webster Capital LLC, Wilmington, DE (US)

(72) Inventor: Sébastien Bolis, Crolles (FR)

(73) Assignee: Webster Capital LLC, Wilmington, DE (US)

( * ) Notice: Subject to any disclaimer, the term of this patent is extended or adjusted under 35 U.S.C. 154(b) by 0 days.

(21) Appl. No.: 15/531,337

(22) PCT Filed: Dec. 3, 2015

(86) PCT No.: PCT/EP2015/078563
§ 371 (c)(1),
(2) Date: May 26, 2017

(87) PCT Pub. No.: WO2016/087602
PCT Pub. Date: Jun. 9, 2016

(65) Prior Publication Data
US 2017/0322478 A1    Nov. 9, 2017

(30) Foreign Application Priority Data
Dec. 4, 2014    (FR) .................................. 14 61907

(51) Int. Cl.
*G02B 26/00*    (2006.01)
*G02B 7/02*    (2006.01)
(Continued)

(52) U.S. Cl.
CPC ............... *G03B 13/36* (2013.01); *G02B 3/14* (2013.01); *G02B 7/028* (2013.01);
(Continued)

(58) Field of Classification Search
CPC ........ G02B 26/004; G02B 7/028; G02B 7/185; G02B 13/0075; G02B 13/0085;
(Continued)

(56) References Cited

U.S. PATENT DOCUMENTS 6,188,526 B1 * 2/2001 Sasaya ..................... G02B 1/06
359/666
7,453,646 B2 * 11/2008 Lo ............................ G02B 1/06
359/665
(Continued)

FOREIGN PATENT DOCUMENTS

JP    2011112757    6/2011

OTHER PUBLICATIONS

International Search Report and Written Opinion from PCT/EP2015/078563, dated Mar. 9, 2016, Wavelens, pp. 1-14.

*Primary Examiner* — Marly S Camargo
(74) *Attorney, Agent, or Firm* — Robert C. Kowert; Meyertons, Hood, Kivlin, Kowert & Goetzel, P.C.

(57) ABSTRACT

The invention relates to an autofocus camera (1) comprising: —an image sensor (10), —an optical block (20) comprising a plurality of lenses with fixed focal length, —an optical device (30) with variable focal length comprising: •a deformable membrane (301), •a support (302) to which a peripheral anchoring area (301c) of said membrane is connected, •a cavity (303) filled with a constant volume of fluid, said cavity being delimited at least in part by said membrane (301) and a support wall (302), •an actuation device (304) of a region (301b) of the membrane located between the peripheral anchoring area (301c) and a central part (301a) of the membrane, configured to bend by application of electrical actuation voltage so as to displace some of the fluid volume towards the center or towards the periphery of the cavity (303), wherein at least one region distinct from the central part (301a) and of the actuation region (301b) of the (Continued)

membrane is stressed mechanically permanently so as to cause permanent deformation of the central part of the membrane by the fluid, the focal distance of the optical device (30) at rest under the effect of said mechanical stress being different from the focal distance of said optical device at rest prior to application of said stress.

20 Claims, 22 Drawing Sheets

(51) Int. Cl.
- *G02B 7/18* (2006.01)
- *G02B 13/00* (2006.01)
- *G02B 3/14* (2006.01)
- *G02B 1/06* (2006.01)
- *G03B 13/36* (2006.01)

(52) U.S. Cl.
CPC ..... *G02B 13/0075* (2013.01); *G02B 13/0085* (2013.01); *G02B 26/004* (2013.01); *H01L 2224/48091* (2013.01)

(58) Field of Classification Search
CPC .. G02B 3/14; G02B 1/06; G03B 13/36; H01L 2224/48091
USPC ......... 348/345–352, 335; 359/665–667, 684, 359/846; 396/79–83, 85, 379
See application file for complete search history.

(56) References Cited

U.S. PATENT DOCUMENTS

| | | | |
|---|---|---|---|
| 8,282,004 B2* | 10/2012 | Wang | G06K 7/00 |
| 8,587,874 B2* | 11/2013 | Kong | G02B 1/06 |
| | | | 359/665 |
| 8,755,124 B2* | 6/2014 | Aschwanden | G02B 26/004 |
| | | | 359/666 |
| 2007/0030573 A1 | 2/2007 | Batchko | |
| 2009/0128922 A1* | 5/2009 | Justis | G02B 3/14 |
| | | | 359/666 |
| 2010/0118414 A1 | 5/2010 | Bolis | |
| 2010/0165475 A1* | 7/2010 | Lee | G02B 1/06 |
| | | | 359/666 |
| 2010/0208357 A1 | 8/2010 | Batchko | |
| 2012/0069450 A1* | 3/2012 | Bolis | G02B 3/14 |
| | | | 359/665 |
| 2012/0170920 A1* | 7/2012 | Moreau | G02B 3/14 |
| | | | 396/72 |
| 2012/0261551 A1* | 10/2012 | Rogers | G02B 3/14 |
| | | | 250/208.1 |
| 2013/0128368 A1* | 5/2013 | Costache | G02B 3/14 |
| | | | 359/666 |

* cited by examiner

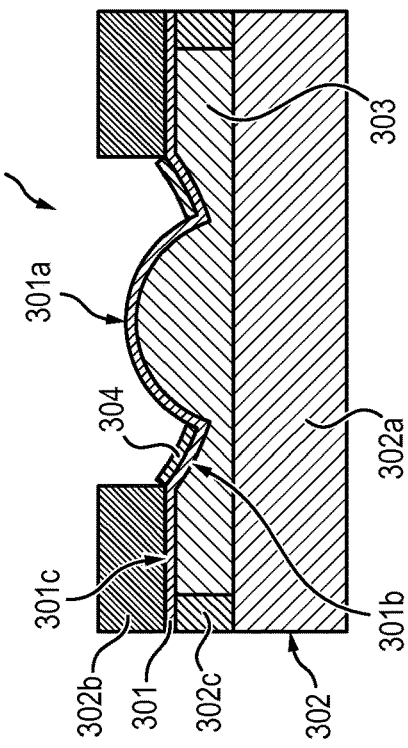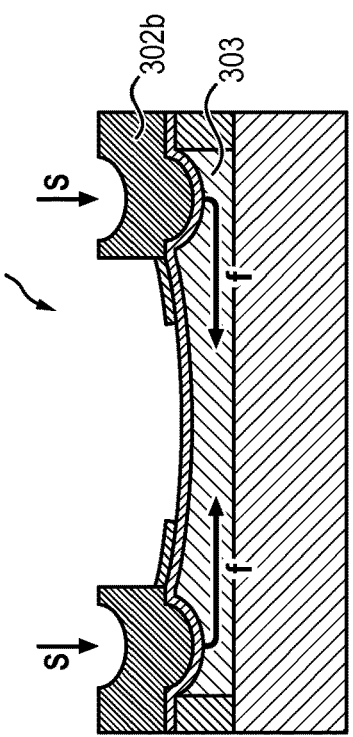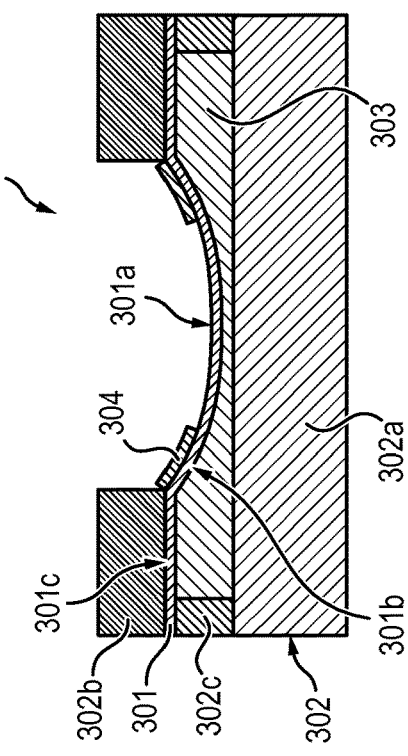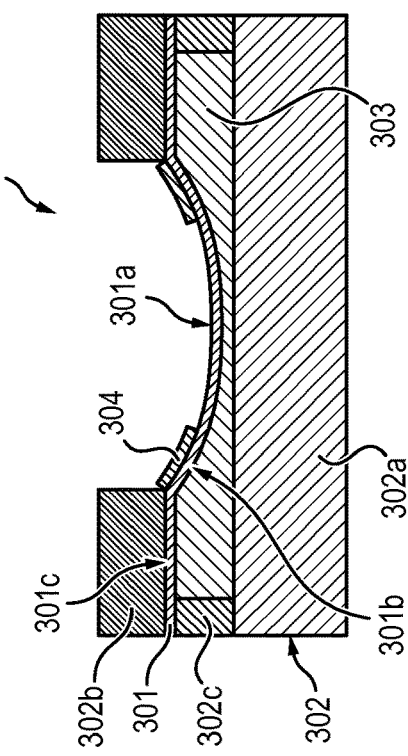

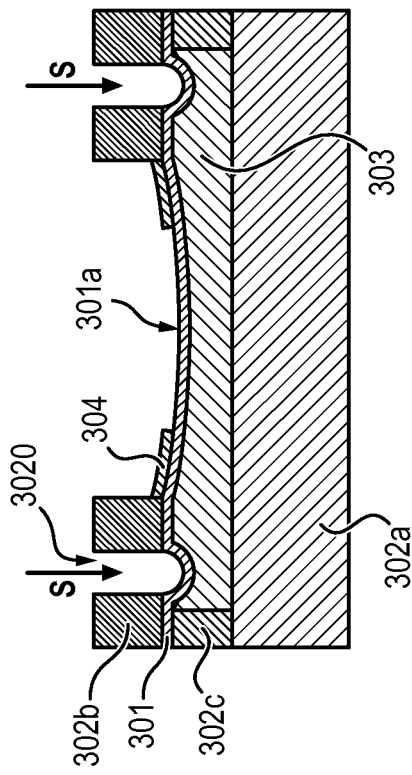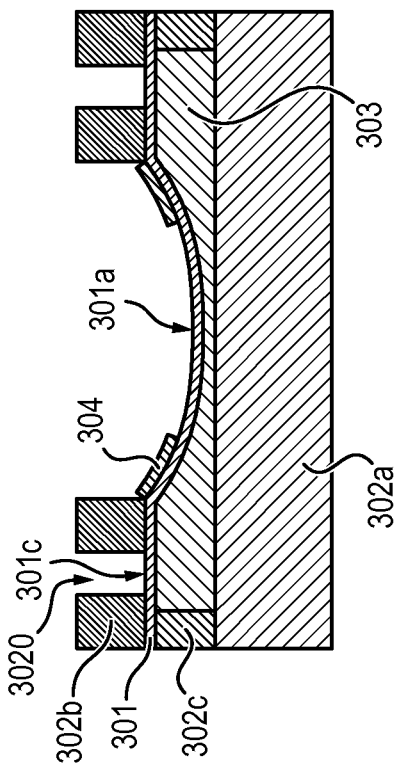
FIG. 9A   FIG. 9B
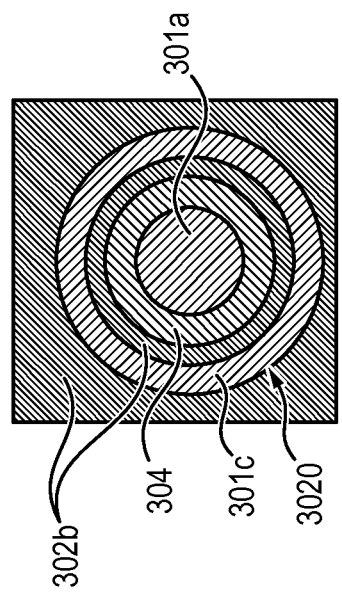
FIG. 10A   FIG. 10B

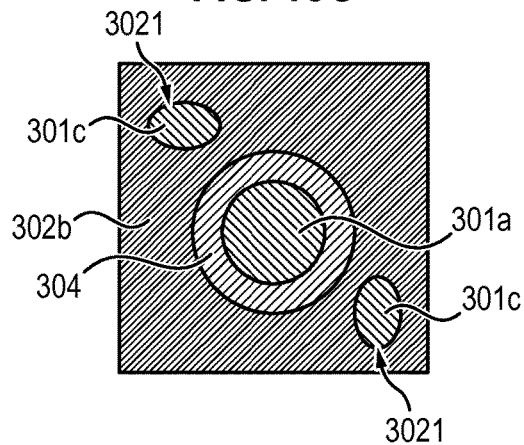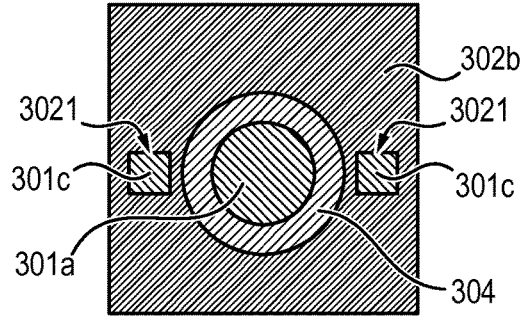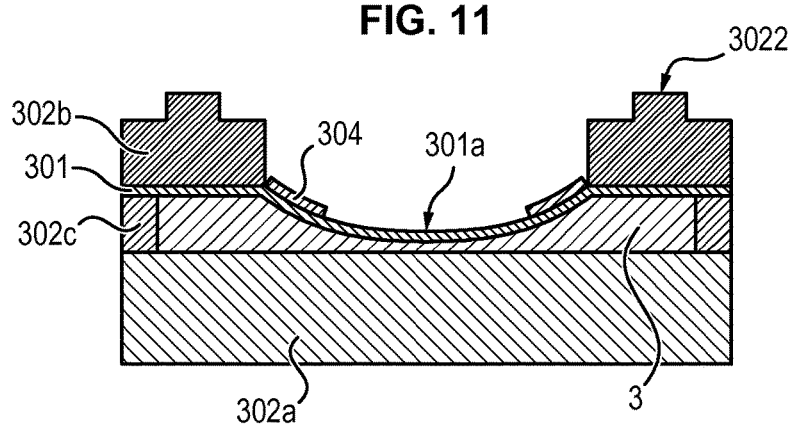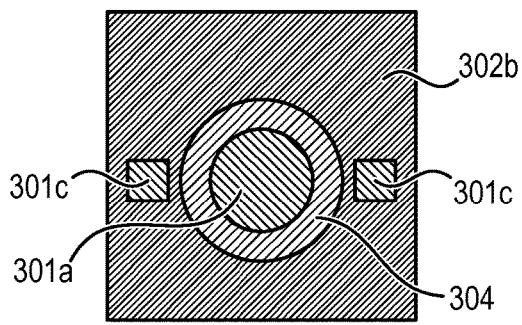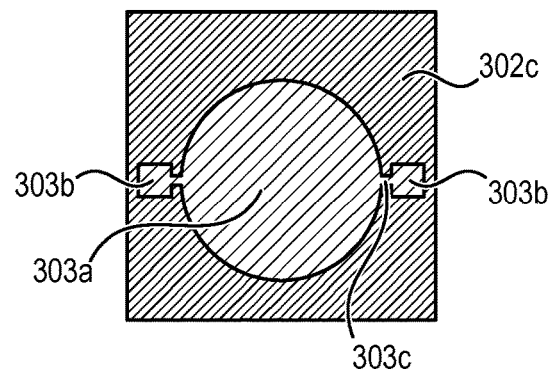

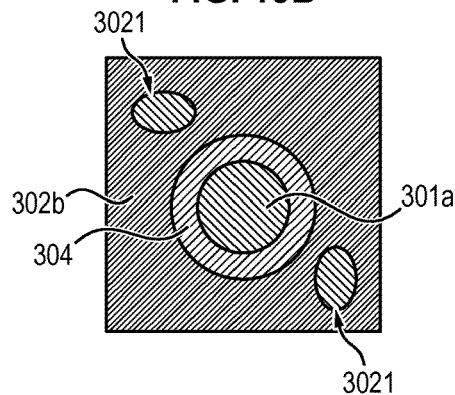
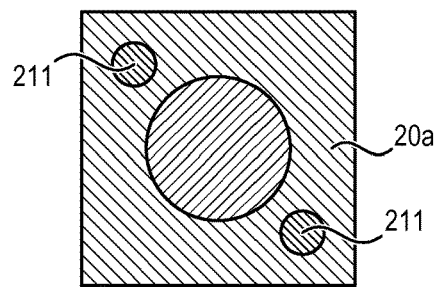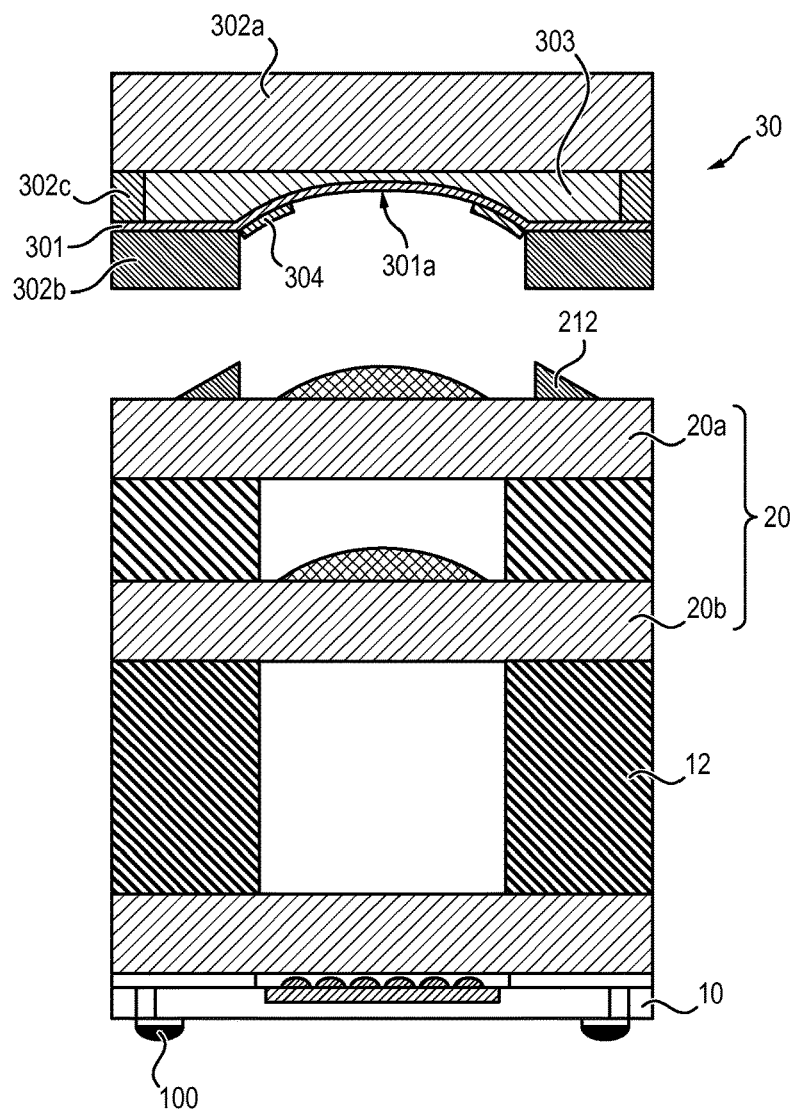

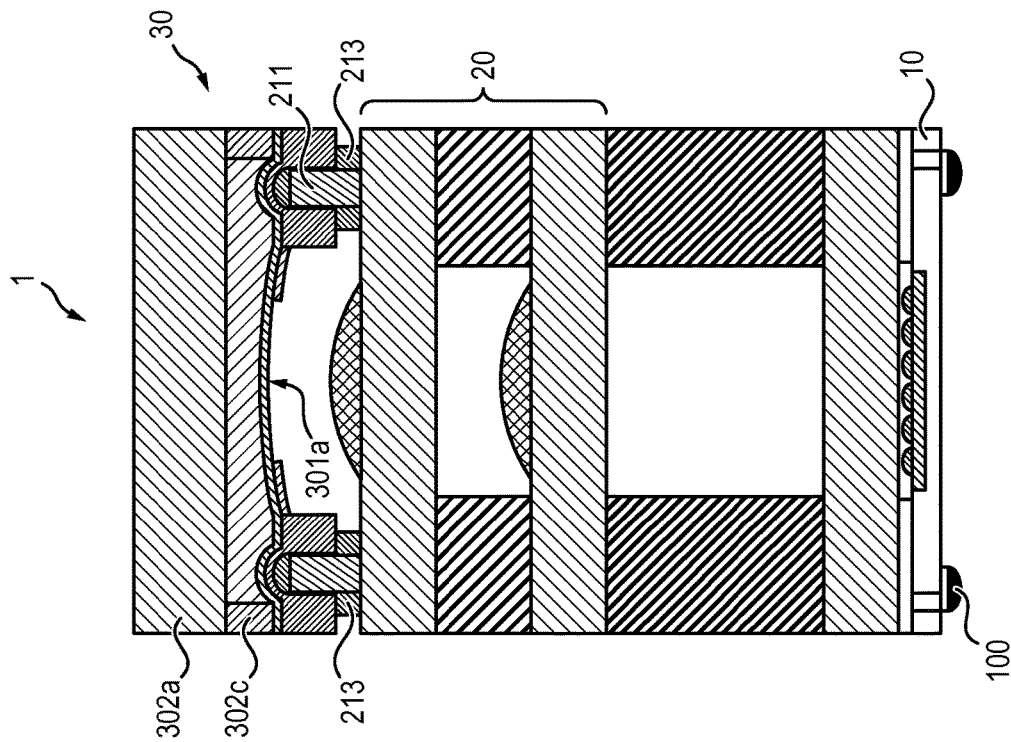
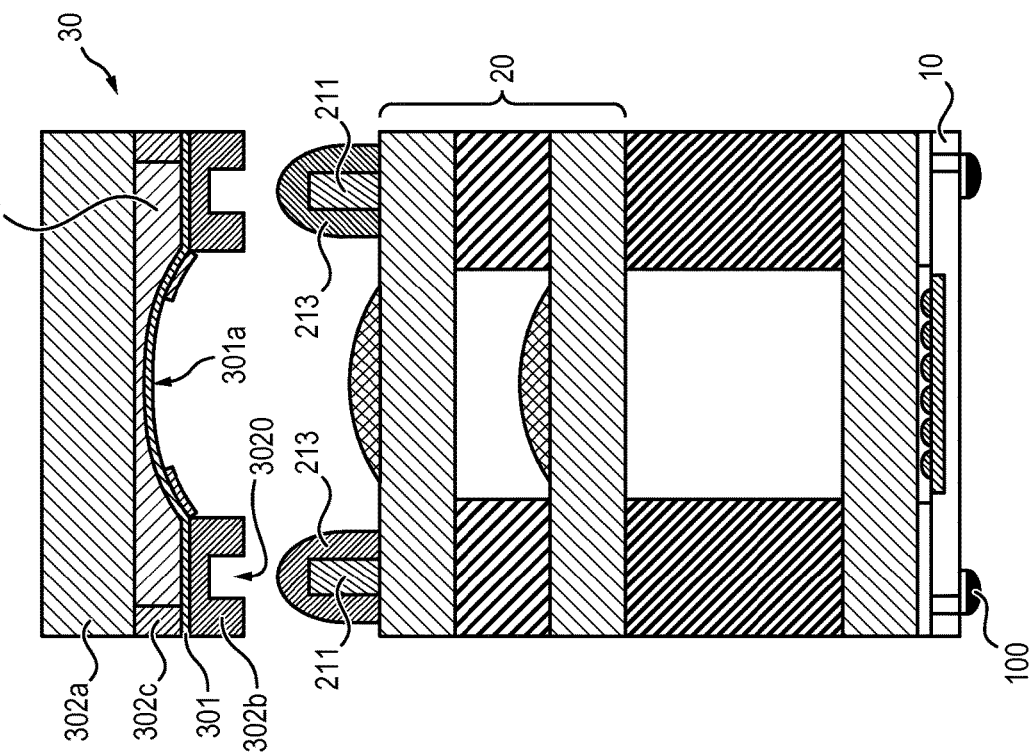

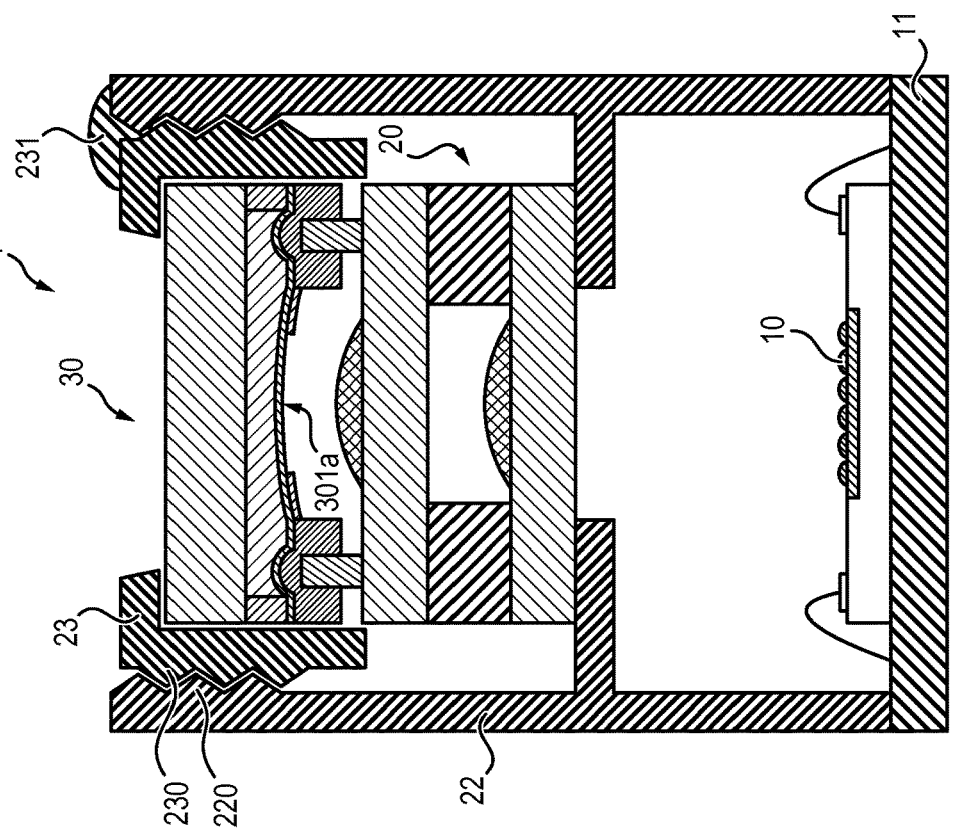
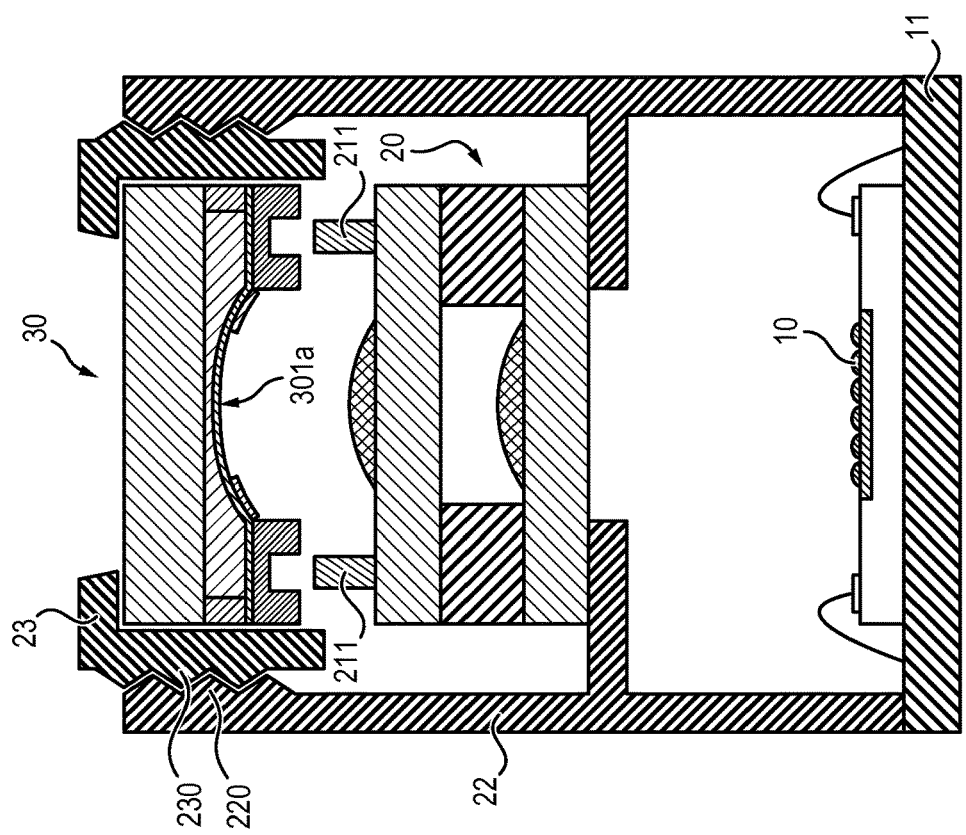

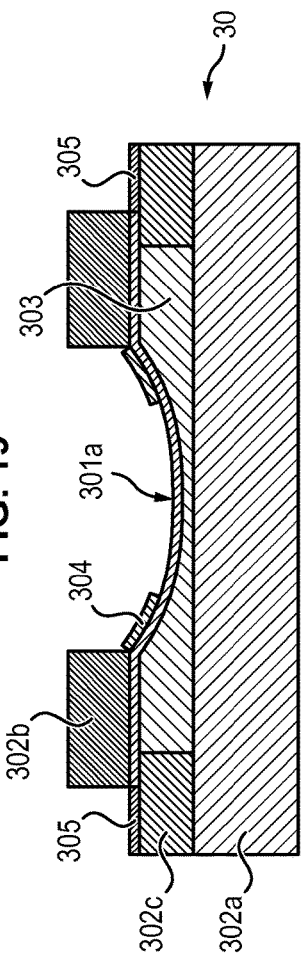
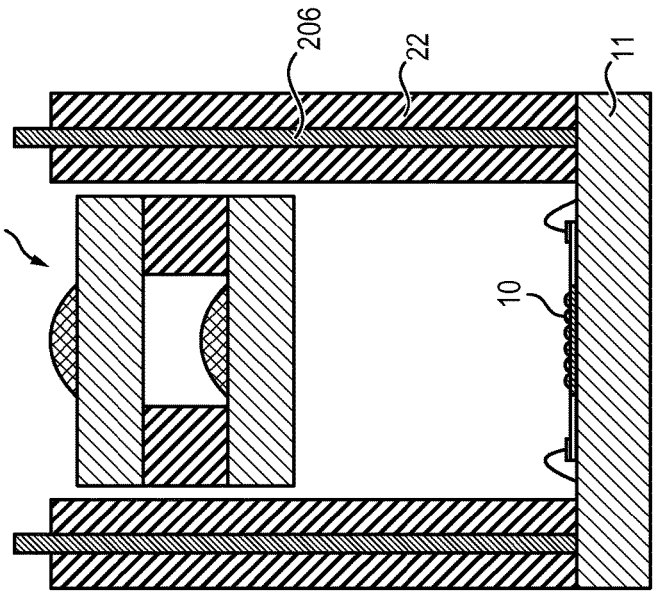
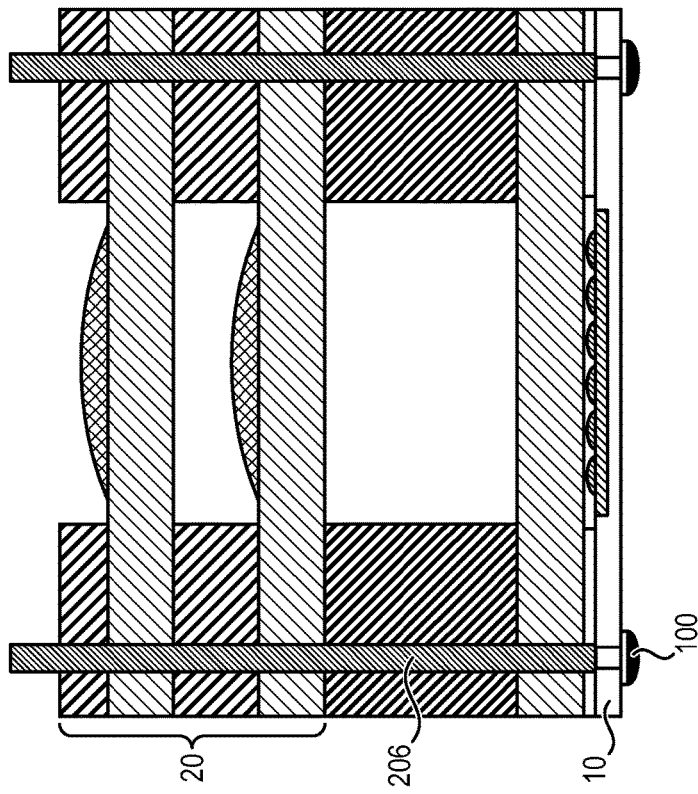

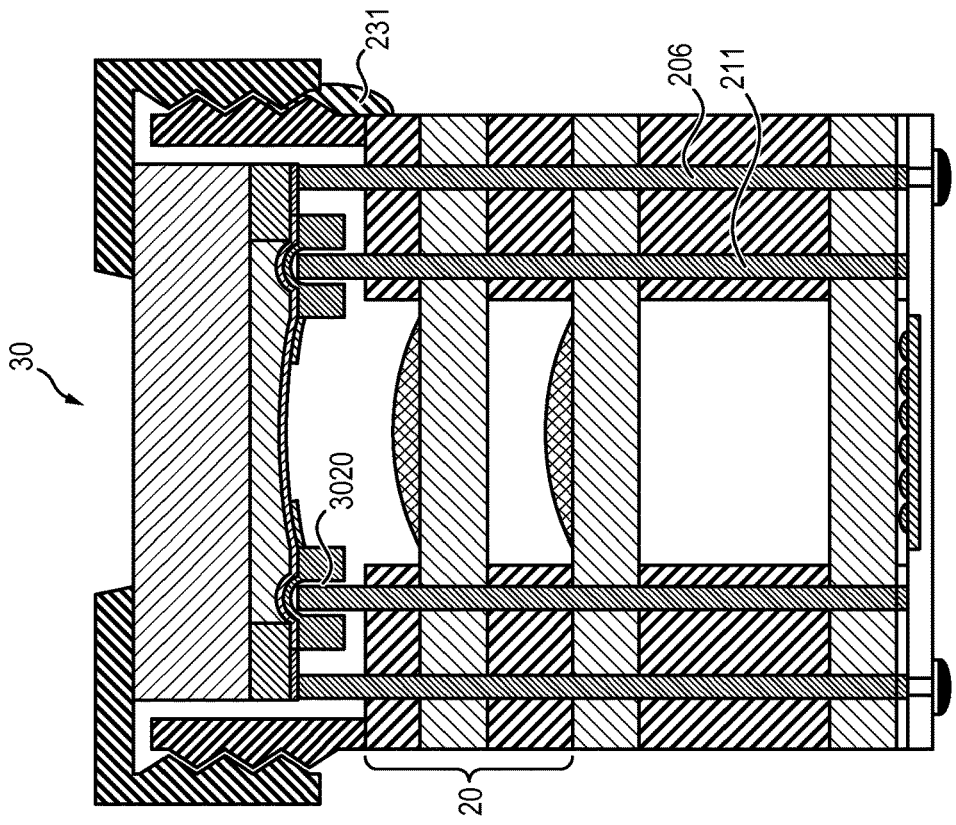
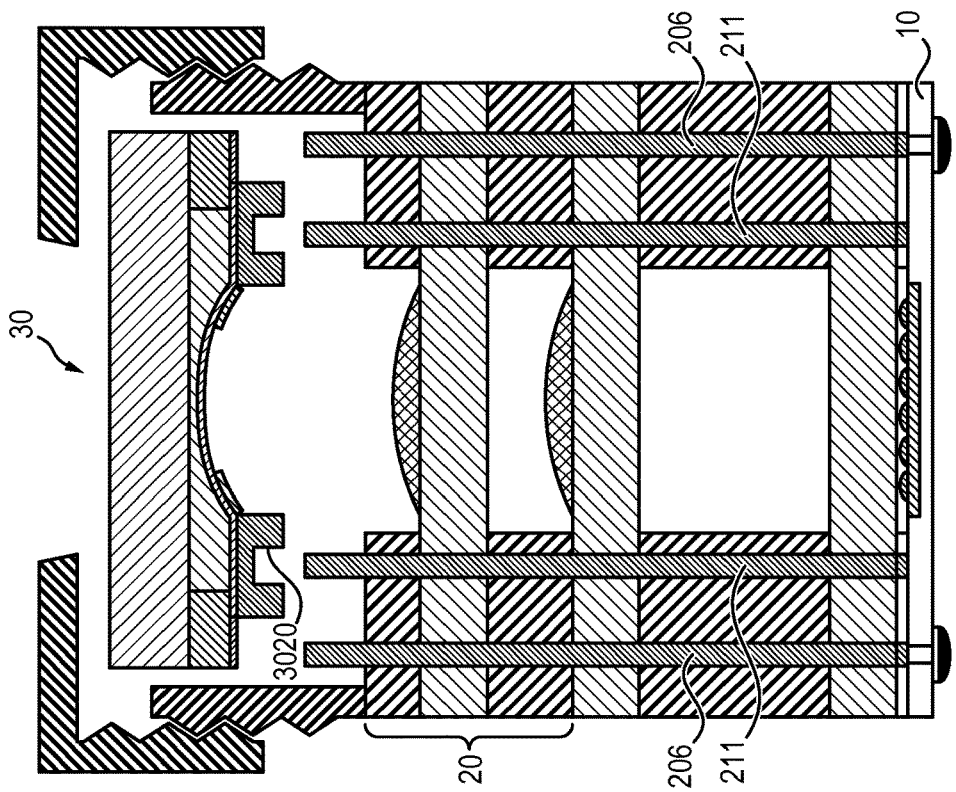

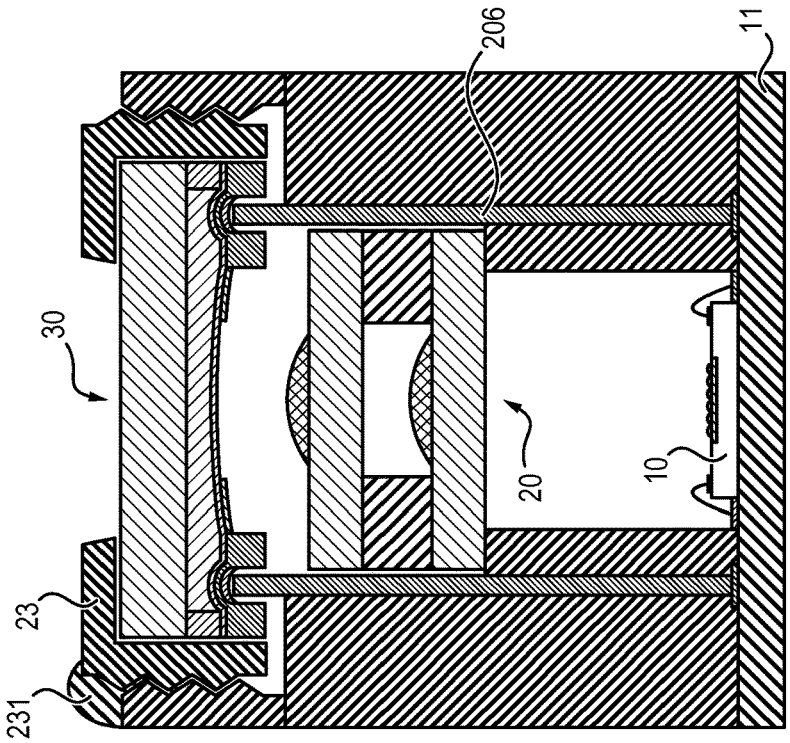
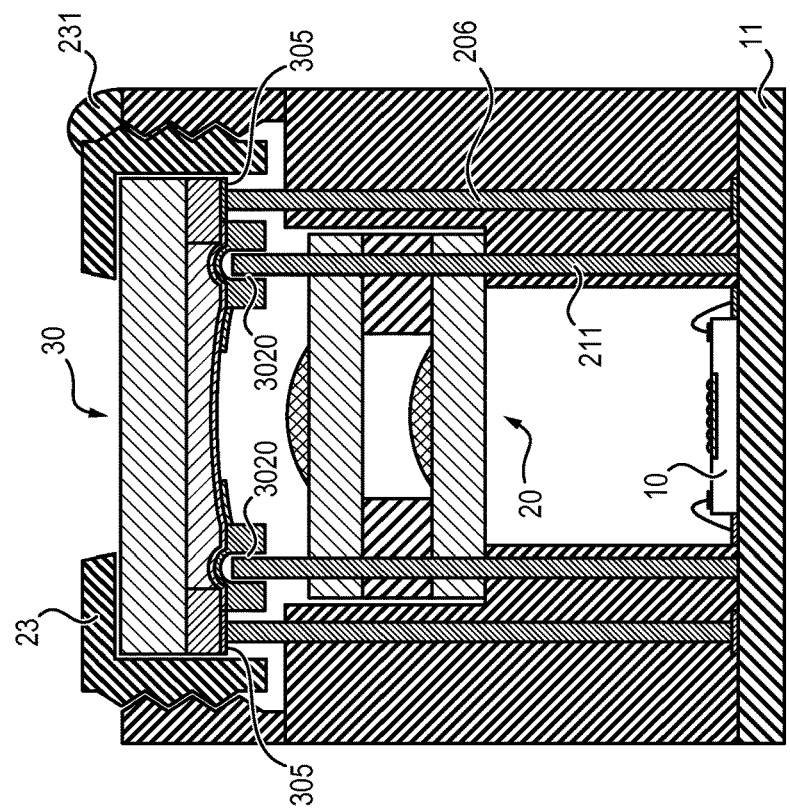

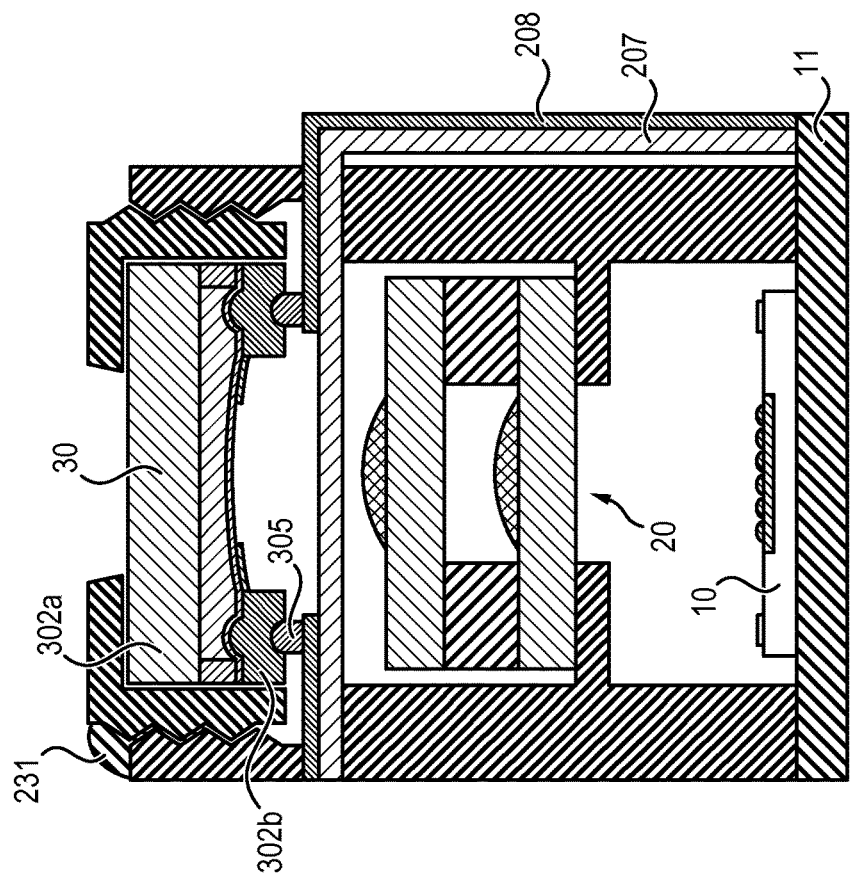
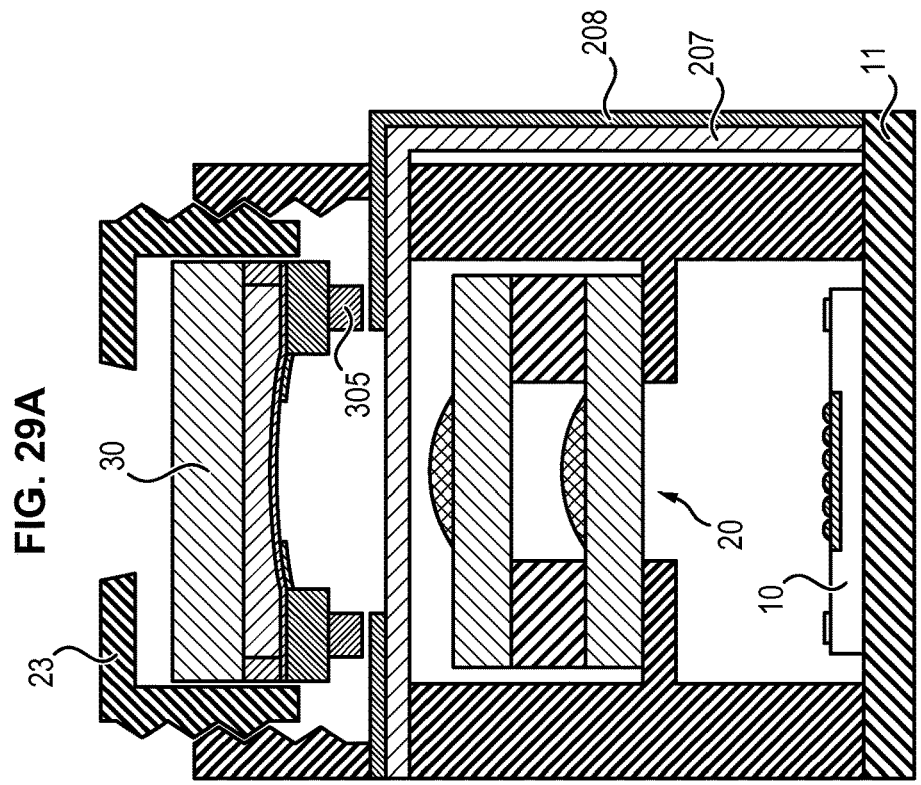

AUTOFOCUS CAMERA AND OPTICAL DEVICE WITH VARIABLE FOCAL LENGTH INTENDED TO BE INTEGRATED INTO SUCH A CAMERA

FIELD OF THE INVENTION

The present invention relates to an autofocus camera, an optical device with variable focal length intended to be integrated into such a camera, and a manufacturing method of such a camera.

BACKGROUND OF THE INVENTION

FIG. 1 is an exploded view of an example of a miniature camera with fixed focal length.

This type of camera 1 comprises an image sensor 10 arranged on a substrate 11, an optical block 20 comprising several lenses 20a, 20b, 20c assembled in a barrel 21, and a mount 22 with which the substrate 11 and the barrel 21 are assembled.

After such a camera leaves manufacturing, a focusing operation is generally necessary for objects located at infinity and captured by the camera to be clear.

This focusing operation consists of moving the barrel 21 containing the lenses relative to the image sensor 10 and making acquisitions of images of an object (typically, a sight) place at infinity or at least at a sufficiently large distance from the camera.

Displacement of the barrel is generally ensured by rotation of said barrel in the mount by cooperation of a thread 210 of the barrel and an inner thread 220 of the mount.

Analysis of images during this displacement determines the position of the barrel corresponding to the maximum sharpness of the image.

The barrel 21 is then fixed in this position in the mount 22, for example by way of local welding at the junction between the mount 22 and the barrel 21.

Other cameras comprise a function called "autofocus" which consists of automatically ensuring the sharpness of a captured object, whether lying at infinity or near the camera.

To ensure this function, a current solution is to integrate an optical device with variable focal length at the front of the camera, that is, upstream of the fixed optical block on the path of light towards the image sensor.

Among optical devices which can be used for this purpose, devices comprising a deformable membrane can be selected advantageously. Documents FR2919073, FR2950154 and FR2950153 describe examples of such devices with deformable membrane. These devices comprise generally: at least one deformable membrane; a support to which a peripheral anchoring area of said membrane is connected; a cavity filled with a constant volume of fluid, said cavity being delimited in part by said membrane; an actuation device of a area of the membrane located between the peripheral anchoring area and a central part of the membrane, configured to bend by application of electrical actuation voltage so as to displace some of the fluid volume towards the centre or the periphery of the cavity.

FIG. 2 is an exploded view of an autofocus camera 1 integrating an optical device with variable focal length 30. The elements designated by the same reference numerals as in FIG. 1 fulfil the same function and are therefore not described again.

The optical device with variable focal length comprises an optical area whereof the focal length is adjustable and a device for electrical connection to the substrate.

In general, focusing at infinity is executed before integration of the optical device with variable focal length. In fact, once the optical device with variable focal length 30 is put into place, it is no longer possible to access the barrel 21 containing the fixed optics to move it due to the presence, in front of the barrel 21, of the optical device with variable focal length 30 and the connection 31 of the latter with the substrate 11, which prevents rotation of the barrel 21 in the mount 22.

There are two processes for performing focusing of the camera before integration of the optical device with variable focal length.

A first process is based on the same principle as for cameras with fixed focal length, specifically displacement of the barrel comprising the optical block relative to the mount so as to ensure the sharpness of the image of an object located at infinity. In this case, the optical device with variable focal length must have zero optical power (0 dioptre) to maintain focusing of objects located at infinity. To focus an object located near the camera, positive optical power of the order of 10 dioptres is typically required. The range of optical power which the optical device with variable focal length must be able to ensure therefore comprises at least the range between 0 and 10 dioptres.

Even though less well known, it is also possible to conduct focusing at a finite distance, for example 20 cm. In this case, the optical device with variable focal length must have zero optical power (0 dioptre) to maintain focusing objects located at this distance of 20 cm. In this example, to focus on an object located 10 cm from the camera, a positive optical power of the order of 5 dioptres is typically required. An object located at infinity is clear for an optical power of −5 dioptres. The range of optical power which must be ensured by the optical device with variable focal length therefore comprises at least the range between −5 and +5 dioptres. As compared to focusing at infinity, focusing at 20 cm therefore brings in offset of −5 dioptres of the operating range of the optical device with variable focal length.

Some optical devices can see their optical power vary as a function of the service temperature of the camera. Also, the manufacturing can induce dispersions of optical power.

Consequently, to ensure coverage of the required range of optical power, it can be advantageous or even necessary to ensure that the optical device with variable focal length is slightly divergent after manufacturing, for example of the order of −1 to −5 dioptres, or even −10 dioptres in some cases. From a nominal divergent configuration, transition at 0 dioptre and accordingly focusing at infinity are ensured. However, near focusing, needing around 10 dioptres of optical power, is difficult to attain and needs an even greater variation in optical power since the rest position is divergent: a variation of 11 dioptres for an initial position of −1 dioptre, a variation of 15 dioptres for an initial position of −5 dioptres, etc.). This operating principle always needs actuation of the device with variable focal length, whether performing focusing at infinity or near, for example at 20 cm as in the example developed above, and irrespective of the range of operation of the optical device with variable focal length (for example [0; 10] dioptres or [−5; +5] dioptres as in the cases disclosed above).

FIG. 3A illustrates an example of variation in optical power of a device with variable focal length for an autofocus camera focusing according to this first process. In this example, consideration is given to a linear variation of the optical power P (in dioptres) with the electrical voltage U (in volts) applied to the actuation device of the optical device with variable focal length. The optical power at rest (that is, without application of electrical voltage) is −5 dioptres in this example. This diagram shows two ranges of actuation of the device:

a first range (hatching rising from the left to the right) between −5 and 0 dioptres aims merely to compensate the variations in optical power due to manufacturing dispersions and/or variations in temperature.

a second range (hatching descending from left to right) between 0 and 10 dioptres ensures focusing at infinity and near the camera.

The first 3 volts applied to produce zero optical power are not useful for focusing and can therefore be considered as lost; focusing is done in the range of electrical voltage between 3 and 10 V.

In a second focusing process, as in the preceding process the barrel comprising the optical block is moved relative to the mount to ensure sharpness of the image of an object located at infinity; however, once focusing at infinity is carried out, defocusing is purposely introduced by displacement of the barrel relative to its optimal position if the optical power of the device with variable focal length is not zero. Alternatively, instead of focusing at infinity then defocusing, the optical device can be focused directly at a smaller distance. If the optical power of the optical device with variable focal length is zero, the latter must be focused at infinity. This particular focusing is conceived so as to exactly compensate the initial optical power of the device with variable focal length which is then integrated into the camera. In other terms, the ensemble of the optical block and the device with variable focal length at rest must ensure focusing at infinity, actuation being necessary only to ensure near focusing.

FIG. 3B illustrates an example of variation in optical power of the same device with variable focal length as that of FIG. 3A for an autofocus camera focusing according to this second process. The optical power at rest (that is, without application of electrical voltage) is −5 dioptres, which is compensated by defocusing of the fixed optics of the camera by 5 dioptres or direct focusing on an object located 20 cm from the camera. In this case, variation in optical power of 10 dioptres (from −5 to 5 dioptres) is therefore sufficient to carry out focusing at infinity and near. This corresponds to a range of electrical actuation voltage of between 0 and 7 V.

As compared to the first focusing process, this second process has the advantage that the whole range of variation in optical power (and therefore the range of electrical actuation voltage) is used for focusing. Also, the range of electrical actuation voltage is reduced. However, a major disadvantage of this process is that the dispersion after manufacturing of devices with variable focal length must be minimal and well controlled, which is highly restrictive. On the other hand, in the absence of a range of operation for compensating the effects of temperature on the focal length at rest of the device, the service temperature of the camera is likely to directly affect focusing of the camera.

BRIEF DESCRIPTION OF THE INVENTION

An aim of the invention is to rectify these disadvantages and propose an autofocus camera comprising an optical device with variable focal length whereof the focusing is simpler than in existing cameras and which optimises the power necessary for operation of said camera.

In accordance with the invention, an autofocus camera is proposed comprising:

an image sensor,
    an optical block comprising a plurality of lenses with fixed focal length,
    an optical device with variable focal length comprising:
        a deformable membrane,
        a support to which a peripheral anchoring area of said membrane is connected,
        a cavity filled with a constant volume of fluid, said cavity being delimited at least in part by said membrane and a support wall,
        an actuation device of a region of the membrane located between the peripheral anchoring area and a central part of the membrane, configured to bend by application of electrical actuation voltage so as to displace some of the fluid volume towards the centre or towards the periphery of the cavity,
    wherein at least one region of the optical device distinct from the central part and from the actuation region of the membrane is stressed mechanically permanently by a component of the autofocus camera (other than the optical device itself) so as to cause permanent deformation of the central part of the membrane by the fluid, the focal distance of the optical device at rest under the effect of said mechanical stress being different from the focal distance of said optical device at rest prior to application of said stress.

"Optical device at rest" means that no electrical voltage is applied to the actuation device.

According to other advantageous characteristics of said camera:

said mechanical stress comprises force, pressure or torque;

the support comprises a first substrate defining the base of the cavity and a second substrate attached to the anchoring area of the membrane, the first substrate and the second substrate being connected by an adhesive bead defining a circumferential wall of the cavity;

the stressed region is located in the second substrate;

the stressed region is a locally thinner region of the second substrate;

the stressed region is a region of the second substrate through which the anchoring area of the membrane is exposed directly to said stress;

the stressed region is a locally thicker region of the second substrate;

the stressed region is located in the adhesive bead;

the stressed region is located in the first substrate;

the cavity containing the fluid is divided between a central cavity facing the central part of the membrane and a peripheral cavity in fluid connection with the central cavity by at least one channel, and the stressed region is facing said peripheral cavity;

the permanent mechanical stress is exerted by at least one protrusion extending from the optical block towards the stressed region of the device with variable focal length;

the camera comprises interconnecting studs ensuring electrical connection between the image sensor and respective electrical contacts of the optical device with variable focal length arranged in the stressed region, the permanent mechanical stress being ensured by said interconnecting studs;

the image sensor, the optical block and the device with variable focal length are each integrated into a substrate and in that said substrates form a stack;

the optical block and the device with variable focal length are arranged in a mount attached to the image sensor;

the thermal dilation coefficients of the application means of the permanent mechanical stress are selected so as to compensate any temperature drift of the optical power at rest of the optical device with variable focal length and/or of the optical block.

Another object relates to an optical device with variable focal length designed to be integrated into such a camera. This device comprises:

a deformable membrane, a support to which a peripheral anchoring area of said membrane is connected, a cavity filled with a constant volume of fluid, said cavity being delimited at least in part by said membrane and a support wall, an actuation device of a region of the membrane located between the peripheral anchoring area and a central part of the membrane, configured to bend by application of electrical actuation voltage so as to displace some of the fluid volume towards the centre or towards the periphery of the cavity.

This device is characterized in that it comprises at least one region distinct from the central part and the actuation region of the membrane configured to be stressed mechanically permanently by a component of the autofocus camera so as to cause permanent deformation of the membrane by fluid, the focal distance of the optical device at rest under the effect of said mechanical stress being different from the focal distance of said optical device at rest prior to application of said stress.

Another object relates to a manufacturing method of an autofocus camera such as described hereinabove.

This method comprises:

assembly of the optical block on the image sensor, assembly of the optical device with variable focal length on the ensemble formed of the optical block and of the image sensor, said assembly comprising application of mechanical stress on a region of said device separate from the central part and of the actuation region of the membrane, the effect of said stress being shifting some of the fluid volume and deforming the central part of the membrane so as to vary the focal distance of the optical device at rest, simultaneously to application of said mechanical stress, analysis of images acquired by the camera and determination of mechanical stress generating the preferred focusing, finalising the assembly so as to permanently apply said determined mechanical stress.

BRIEF DESCRIPTION OF DRAWINGS

Other characteristics and advantages of the invention will emerge from the following detailed description, in reference to the appended drawings, in which:

FIGS. 5A and 5B are sectional views of an optical device with divergent deformable membrane at rest (FIG. 5A) and becoming convergent with application of electrical actuation voltage (FIG. 5B), FIGS. 6A and 6B illustrate a first embodiment of the invention, in which the optical power at rest is made to vary from an initial configuration (FIG. 6A) by exerting permanent stress on a substrate on which the membrane of the optical device (FIG. 6B) is anchored, FIGS. 9A and 9B are sectional views of an optical device whereof the substrate has a specific structure facilitating the application of permanent stress, before (FIG. 9A) and after (FIG. 9B) application of said stress, FIGS. 10A to 10D illustrate, in plan view, different embodiments of said structure, FIG. 11 illustrates another embodiment of a specific structure of the substrate facilitating application of permanent stress, FIGS. 12A and 12B illustrate another embodiment of a structure specific of the substrate facilitating application of permanent stress, respectively in plan view of the optical device and in partial plan view of the fluid and of the adhesive bead, FIGS. 13B and 13C are respectively a bottom plan view of the optical device and a plan view of the optical block of said camera, FIG. 14A is a sectional view of a camera according to an embodiment, before its assembly ("waferlevel" assembly), FIGS. 17A and 17B illustrate two steps of the focusing of the camera during the assembly of the optical device, according to an embodiment of the invention, in the case of "waferlevel" assembly, FIGS. 18A and 18B illustrate two steps of the focusing of the camera during assembly of the optical device, according to an embodiment of the invention, in the case of a traditional assembly, FIG. 19 is a sectional view of an optical device with deformable membrane on which two interconnecting studs have been shown, FIGS. 20A and 20B are sectional views of the optical block comprising interconnections designed to be coupled to studs of the optical device, respectively in the case of "waferlevel" assembly and in the case of traditional assembly, FIGS. 22A and 22B illustrate two steps of the focusing of the camera during the assembly of the optical device, according to an embodiment of the invention, in the case of "waferlevel" assembly, FIG. 26 is a sectional view of an assembled camera (traditional assembly), FIG. 27 is a sectional view of an assembled camera (traditional assembly), FIGS. 29A and 29B illustrate focusing steps of the camera during assembly of the optical device, according to an embodiment of the invention, in the case of a traditional assembly.

Figure 1:
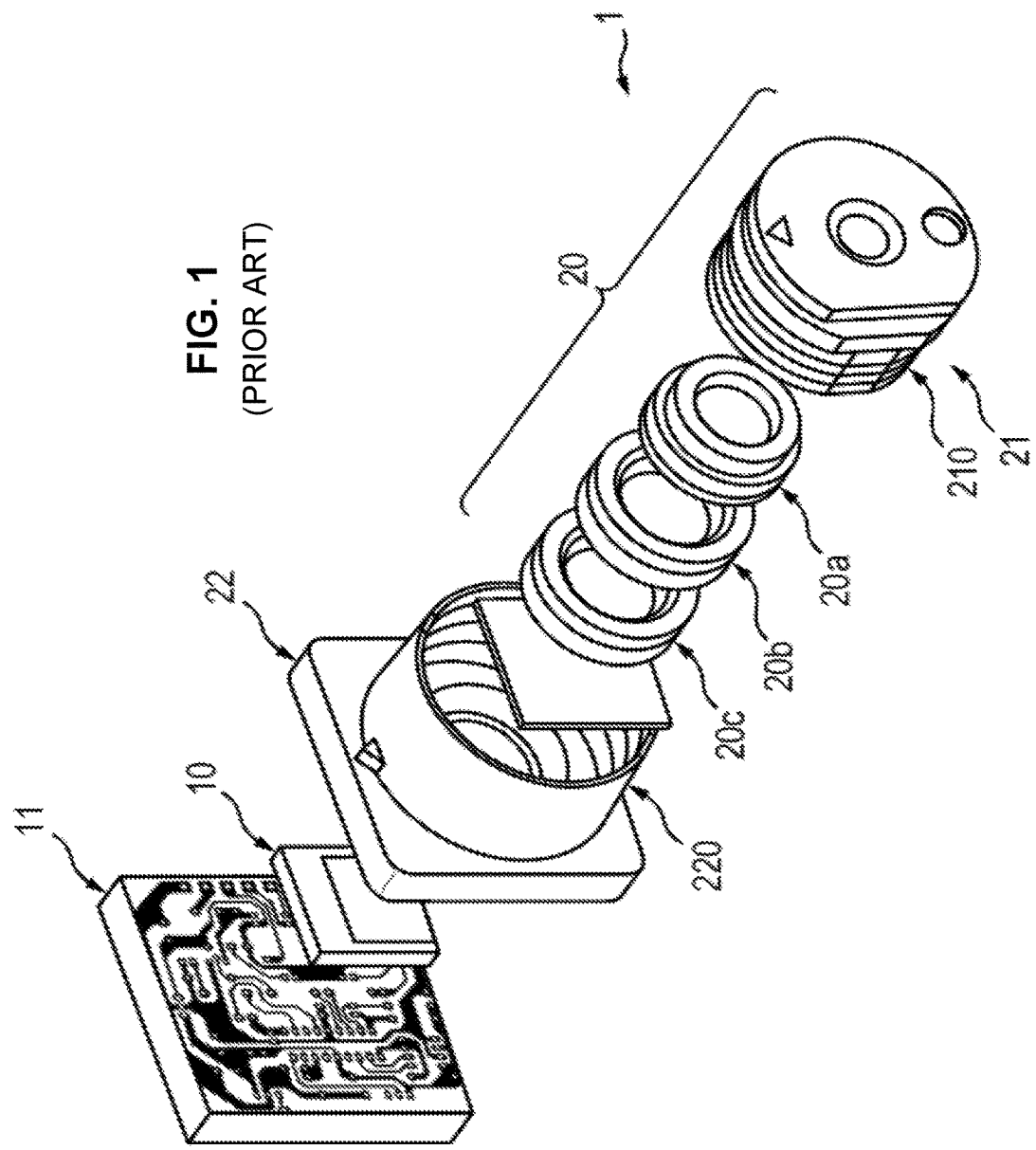
FIG. 1 is an exploded view of an example of a miniature camera with fixed focal length.
Figure 2:
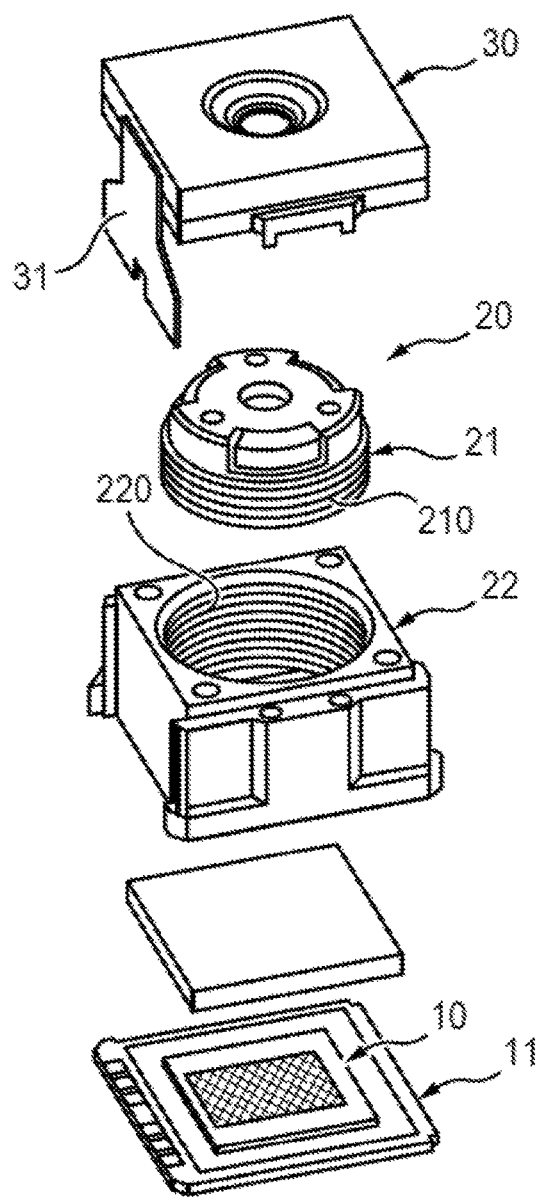
FIG. 2 is an exploded view of an example of a miniature autofocus camera.

For reasons of legibility of the figures, the different elements illustrated are not necessarily shown to the same scale.

The reference numerals are used from one figure to the other to designate the same elements.

DETAILED DESCRIPTION OF THE INVENTION

The camera is made by assembly of different components, the main ones being:

- an optical block comprising a plurality of lenses with fixed focal length, assembled definitively on the camera with controlled positioning. The optical block is not intended to be moved. The precision of positioning the optical block relative to the image sensor depends on the selected transfer technique;
- an optical device with variable focal length generally arranged upstream of the optical block on the path of light towards the image sensor (optionally, the optical device with variable focal length can be integrated into the optical block or even downstream of the optical block on the path of light). As will be evident in detail below, said optical device has the particular feature of being able to vary its optical power at rest (that is, without electrical voltage applied to the actuation device) by mechanically stressing at least one of its regions other than the central part of the membrane and the actuation region. The effect of this mechanical stress (force, pressure or torque) is to displace some of the fluid volume, which causes deformation of the central part of the membrane. Since the mechanical stress is permanent, deformation of the central part of the membrane is permanent. The optical power is therefore modified permanently relative to the optical power of the device prior to application of this stress. This stress however does not alter the performance of variation in focal length of the optical device under power;
- one or more structures intended to stress the device with variable focal length during the focusing step. This structure or these structures can be integrated into the optical device with variable focal length and/or the optical block (lens or mount).

The camera is focused from said assembly, by more or less stressing a region of the device with variable focal length provided to vary the initial optical power by means of the structure provided for this purpose. Analysis of images during the application of this stress (generally comprising the modulation transfer function (MTF)) determines the ideal stress which corresponds to the maximum sharpness of the image. Once optimal focusing is identified, the assembly is fixed in its current condition such that stress applied to the device with variable focal length is maintained permanently over time.

During assembly of the different components, the average position of the optical block relative to the image sensor (and associated dispersion) must be determined as a function of the focal distance of the optical block and variation in optical power at rest which can be achieved by mechanically stressing the device with variable focal length. For a device with variable focal length whereof the optical power increases under the effect of mechanical stress, it is advantageous to place the optical block relative to the image sensor at a distance less than the focal distance of said optical block. So by stressing the device with variable focal length and increasing the optical power of the latter, focusing of the camera at infinity can be undertaken. Similarly, for a device with variable focal length whereof the optical power drops under the effect of mechanical stress, it is advantageous to place the optical block relative to the image sensor at a distance greater than the focal distance of said optical block. Therefore, infinite focusing can be achieved by mechanically stressing the device with variable focal length and decreasing the optical power of the latter.

In both cases, the range of variation in initial optical power must be able to compensate the position (approximate) of the optical block relative to the focal distance.

Figure 4:
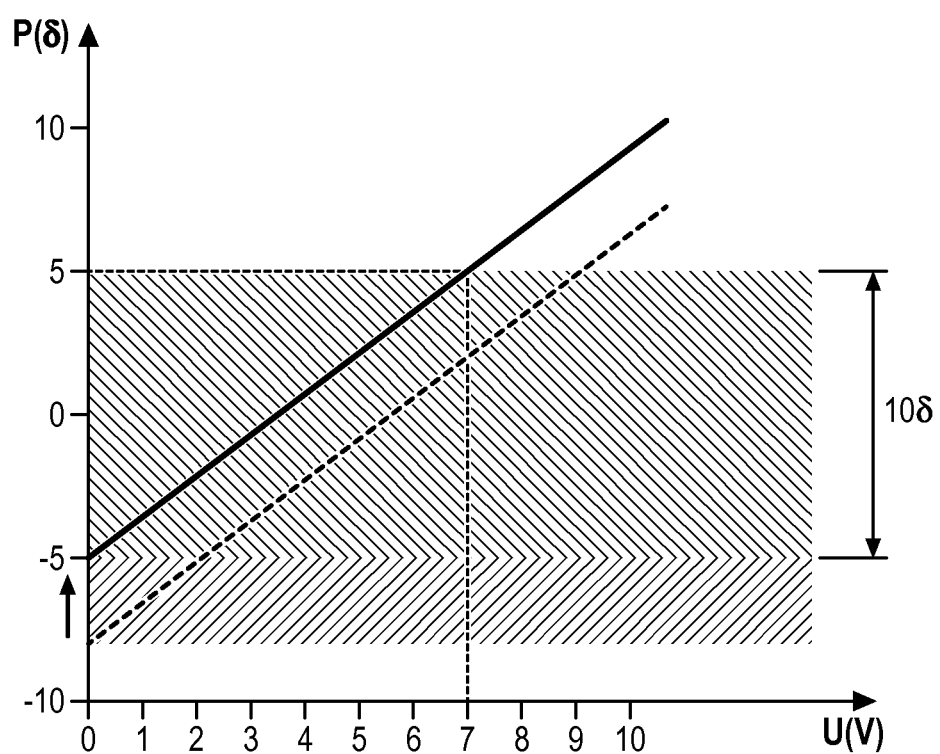
FIG. 4 illustrates an example of variation in optical power of a device with variable focal length for an autofocus camera according to the invention.

FIG. 4 illustrates an example of variation in optical power of a device with variable focal length for an autofocus camera according to the invention, whereof the range of operation is between −5 and +5 dioptres. Naturally, this example can be transposed to any other range of operation.

In this example, the initial optical power (prior to application of mechanical stress) of the device is −7 dioptres. The optical block is positioned at a distance from the image sensor less than the focal distance. By permanently and mechanically stressing the optical device, the optical power is boosted to −5 dioptres, which produces focusing at infinity (defocusing of the optical block to the torque of the assembly in this case was −2 dioptres).

Figure 3A:
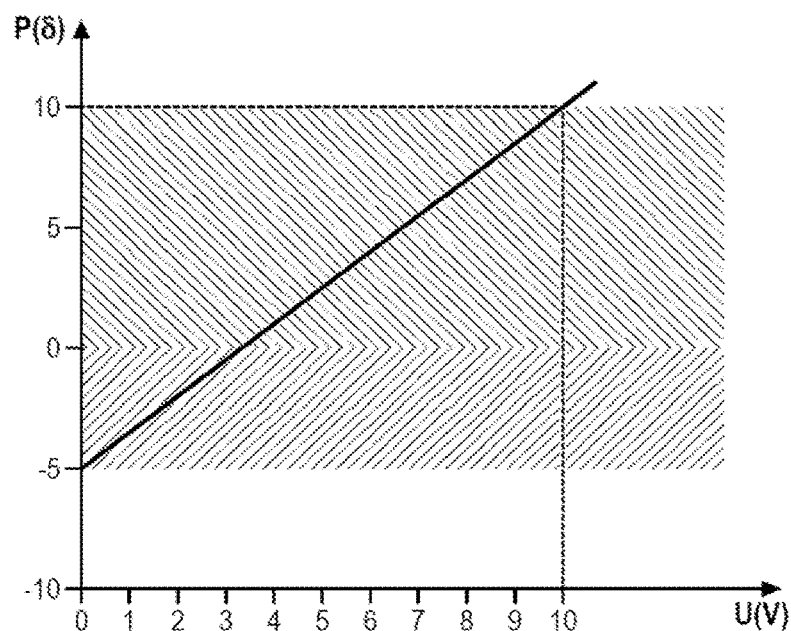
FIG. 3A illustrates an example of variation in optical power of a device with variable focal length for an autofocus camera focusing according to a first known process.
Figure 3B:
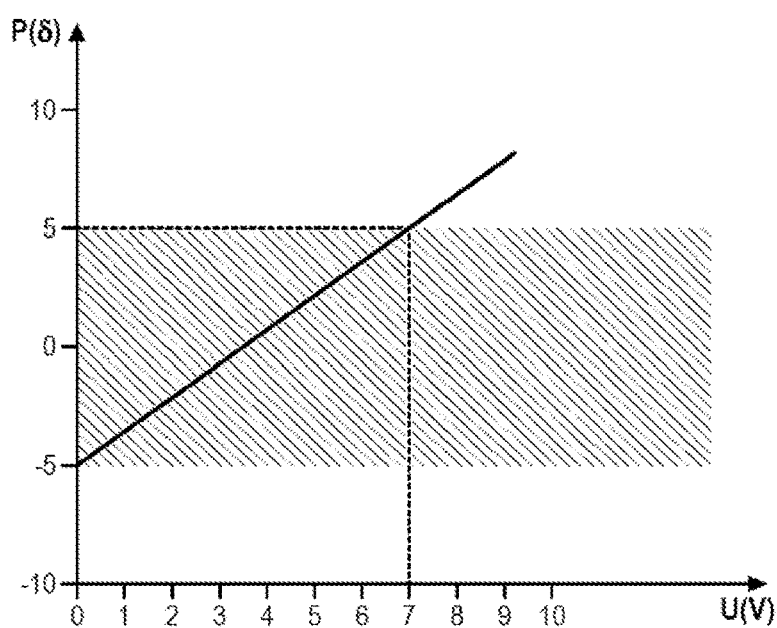
FIG. 3B illustrates an example of variation in optical power of a device with variable focal length for an autofocus camera focusing according to a second known process.

The present invention benefits from the advantages of both known approaches described in reference to FIGS. 3A and 3B without any of the disadvantages. In fact, the whole range of optical power of the device with variable focal length (10 dioptres) remains exploited. The constraint on the dispersion of the position at rest after production of devices with variable focal length is relaxed to the extent where the stress exerted during the focusing function is capable of compensating this dispersion and enables the focusing function.

This solution is particularly advantageous for 'low-resolution' cameras for which the focusing function is mostly avoided, for technical and economic reasons. The present invention proposes a solution for focusing for these cameras compatible with the very high dimensional requirement and with manufacturing of "waferlevel" type.

Finally, such a solution can optionally compensate the effect of temperature on the initial optical power of the device with variable focal length, as needed. In temperature, the permanent mechanical stress exerted on the device with variable focal length can advantageously be dimensioned to counterbalance any variation in the initial optical power of the device and optionally the optical block.

In a first instance, different embodiments of the optical device with variable focal length will be described.

As indicated earlier, said optical device has the particular feature of being able to vary its initial optical power (i.e. without electrical actuation voltage applied) by stressing at least one of its surfaces. Optical MEMS with deformable membrane comprising fluid are particularly advantageous. In FIGS. 5A to 18B, the electrical interconnection studs of the optical device with variable focal length are not shown for reasons of simplification and so as not to overload the drawings.

In the example illustrated in FIGS. 5A and 5B, the optical device 30 is slightly divergent at rest (FIG. 5A) and convergent in actuation (FIG. 5B).

The device 30 comprises a deformable membrane 301, a support 302 to which a peripheral anchoring area 301c of said membrane is connected, and a cavity 303 filled with a constant volume of fluid, said cavity being delimited at least in part by the membrane 301 and a support wall 302.

The membrane comprises a central part 301a which defines an optical field of the optical device.

The membrane therefore comprises a face, so-called inner face, which is in contact with the fluid, and an opposite face, so-called outer face, in contact with a second fluid which can be ambient air. The fluid is advantageously liquid such as propylene carbonate, water, an index liquid, an optic oil or an ionic liquid, a silicone oil, an inert liquid with high thermal stability and low saturating vapour pressure.

Membrane means any supple and tight film, such that the membrane forms a barrier between the fluid contained in the cavity and the fluid located on the opposite face of the membrane. The membrane can be made based on organic materials such as polydimethyl siloxane, polymethyl methacrylate, polyethylene terephthalate, polycarbonate, parylene, epoxy resins, photosensitive polymers, silicones, or mineral materials such as silicon, silicon oxide, silicon nitride, polycrystalline silicon, diamond carbon. The membrane can comprise a single layer of the same material or a stack of layers of different materials.

With the optical device functioning in transmission, the membrane and the base of the cavity are transparent, at least in their central part, to an optical beam intended to propagate via the lens, successively passing through the central part of the membrane, the fluid and the base of the cavity.

The fluid is sufficiently incompressible to move towards the central part of the device when force is applied to the membrane in the direction of the fluid, this force being applied in an intermediate part 301b between the anchoring area and the central part of the membrane.

The support 302 can comprise a first substrate 302a (for example glass) defining the base of the cavity and a second substrate 302b (for example silicon) attached to the anchoring area 301c of the membrane, the first substrate and the second substrate being connected by an adhesive bead 302c defining a circumferential wall of the cavity 303.

An actuation device 304 of a region 301b of the membrane (so-called "actuation region") located between the peripheral anchoring area 301c and a central part 301a of the membrane, is configured to bend by application of electrical actuation voltage so as to displace some of the fluid volume towards the centre or towards the periphery of the cavity 303.

Those skilled in the art know different actuation devices used to actuate membranes.

These devices are based on different technologies, examples of which are piezoelectric actuation, electrostatic, electromagnetic, thermal actuation or even based on electroactive polymers.

In this respect reference could be made to such actuation devices in documents FR2919073, FR2950154 and FR2950153.

The choice of actuation technology and dimensioning of the actuation device depends on expected performance levels (for example, electrical consumption), stresses to which it will be subjected during operation of the device, and considerations relative to the electrical actuation voltage to be applied.

For example, an actuation device particularly adapted is based on piezoelectric technology. It is recalled that a piezoelectric actuator comprises a block of piezoelectric material sandwiched totally or partially between two electrodes, when fed, intended to apply an electrical field to the piezoelectric material. This electrical field is used to control mechanical deformation of the block of piezoelectric material. The block of piezoelectric material can be monolayer or multilayer and extend beyond one electrode. PZT is preferably selected as piezoelectric material.

The actuation device can comprise a single actuator in the form of a crown or else several separate actuators (for example in the form of beams) distributed uniformly over the circumference of the membrane.

Optionally, the actuators can be capable of bending in two opposite direction.

The actuation device can be arranged on the inner face of the membrane, on the outer face or even inside the membrane.

Optionally, the actuation device can extend in part over the peripheral anchoring area.

Many other examples are feasible and not illustrated here. The optical device at rest can especially be convergent or even planar (zero optical power). In actuation, it can become divergent instead of convergent, as illustrated in FIG. 5B.

For such an optical device, it is possible to modify the optical power of the device at rest (that is, in the absence of application of electrical actuation voltage) under the effect of mechanical stress exerted on the structure of the optical device, in a region separate from the central part of the membrane and the actuation region. If such an optical device is integrated into a camera of known type, such a phenomenon of variation in focal distance must be limited. On the contrary, the invention causes this phenomenon and benefits therefrom.

The operating principle of such an optical device is to exert by way of the actuation device pressure in the fluid intended to deform the centre of the membrane and modify the focal distance (or the optical power). Such variation in focal length is also possible without applying electrical voltage to the device but by deforming, via outer stress, the outer structure of the optical device which generally comprises a glass substrate, adhesive and a silicon substrate.

A first embodiment of the invention needs no particular structure for exerting this stress, but consists of dimensioning the outer envelope of the optical device (glass substrate, adhesive or even silicon substrate) such that it can be deformed under the effect of outer stress. As a function of the geometry of these different elements, the thickness of at least one element of the outer envelope can be diminished to make it deformable under the effect of intended the mechanical stress.

The examples illustrated in FIGS. 6A to 8B correspond to a device with variable focal length similar to that illustrated in FIGS. 5A-5B, whereof the optical power increases under the effect of mechanical stress S. The movements of fluid induced by stress towards the centre of the cavity are represented by arrows f.

In the case of FIG. 6B, mechanical stress S is applied on the substrate 302b, in a direction substantially perpendicular to the surface of said substrate and to the anchoring area 301 of the membrane. As compared to the device prior to application of this stress (FIG. 6A), the displacement of fluid has the effect of decreasing the curvature of the central part 301a of the membrane, that is, making the optical device less divergent.

Figure 7A:
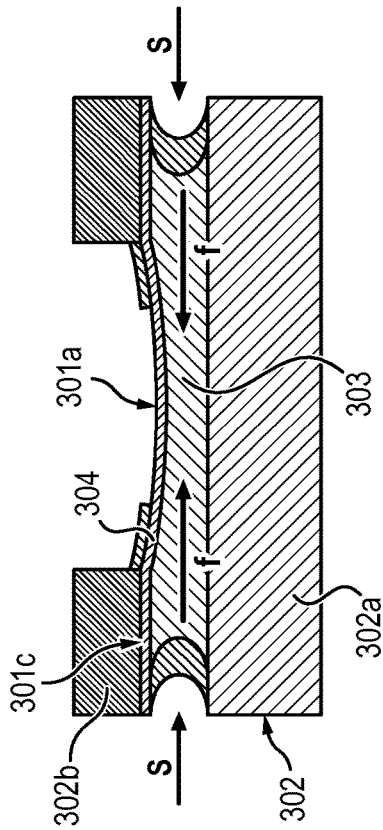
FIGS. 7A and 7B illustrate a second embodiment of the invention, in which the optical power at rest is made to vary from an initial configuration (FIG. 7A) by exerting permanent stress on an adhesive bead connecting the substrate on which the membrane is anchored and the support of the optical device (FIG. 7B)
Figure 7B:
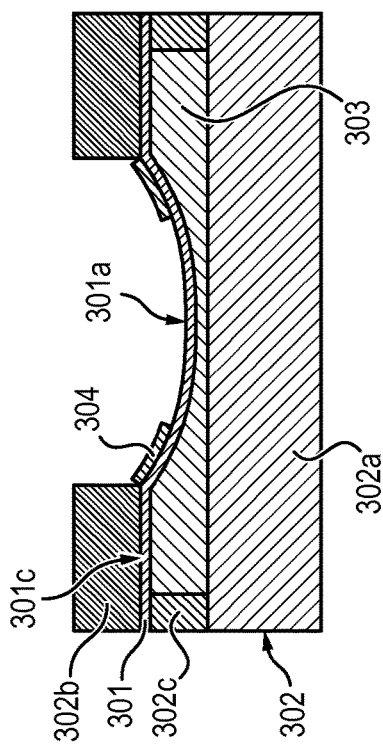

In the case of FIG. 7B, mechanical stress S is applied on the adhesive bead 302c binding the substrates 302a and 302b, in a direction substantially perpendicular to the circumferential wall of the cavity 303. As compared to the device prior to application of this stress (FIG. 7A), the displacement of fluid has the effect of decreasing the curvature of the central part 301a of the membrane, that is, making the optical device less divergent.

Figure 8A:
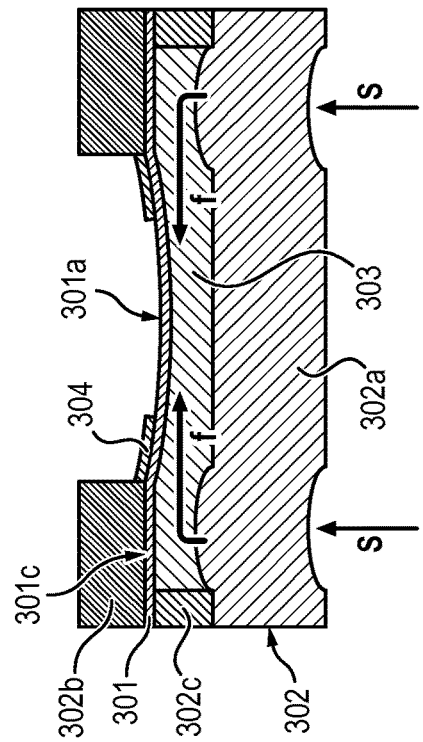
FIGS. 8A and 8B illustrate a third embodiment of the invention, in which the optical power at rest is made to vary from an initial configuration (FIG. 8A) by exerting permanent stress on the support of the optical device (FIG. 8B)
Figure 8B:
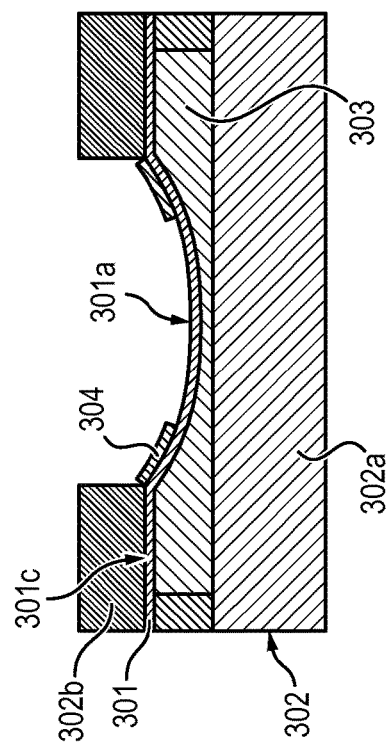

In the case of FIG. 8B, mechanical stress S is applied on the substrate 302a, in a direction substantially perpendicular to the surface of said substrate. Relative to the device prior to application of this stress (FIG. 8A), displacement of fluid has the effect of decreasing the curvature of the central part 301a of the membrane, that is, making the optical device less divergent.

In some embodiments, mechanical stress can be applied locally, non-symmetrically relative to a plane or an axis of symmetry of the optical device. Alternatively, the stress can be applied symmetrically.

In the case of FIGS. 6A to 8B, mechanical stress has the effect of pushing more liquid towards the centre of the cavity to boost the initial optical power of the device. It is however possible to configure said mechanical stress to diminish the amount of fluid at the centre of the cavity to decrease the optical power of the device.

Also, mechanical stress combined on the different elements of the optical device constituting its outer envelope (specifically the two substrates 302a, 302b and the adhesive bead 302c) is also possible.

In any case, mechanical stress is applied neither in the central part 301a of the membrane nor in the actuation area 301b to keep electro-optical performances of the optical device to a maximum after the focusing operation.

It can be advantageous to provide particular structures in the optical device intended to facilitate variation in optical power under the effect of mechanical stress or facilitate application of the stress to the preferred region of the optical device.

Therefore, as illustrated in FIGS. 9A and 9B, the substrate 302b can be locally etched so as to form a groove 3020 over the entire thickness of said substrate, to exert mechanical stress S directly on to the anchoring area 301c of the membrane which deforms more easily than the substrate.

FIGS. 10A to 10D illustrate, in plan view, different arrangements of a structure in the substrate 302b apply mechanical stress directly to the anchoring area 301c of the membrane.

In the case of FIG. 10A, the structure is an annular groove 3020 formed in the substrate 302b so as to expose part of the anchoring area 301c of the membrane. This groove 3020 encloses the central part 301a and the area comprising the actuation device 304 of the membrane.

In the case of FIG. 10B, the structure is a circular hole 3021 formed in the substrate 302b so as to expose part of the anchoring area 301c of the membrane.

In the case of FIG. 10C, the structure is composed of two oblong holes 3021 formed in the substrate 302b so as to expose part of the anchoring area 301c of the membrane. These holes oblong are for example diametrically opposite relative to the central part 301a of the membrane, and oriented such that their main axes are perpendicular.

In the case of FIG. 10D, the structure comprises two square holes 3021 formed in the substrate 302b so as to expose part of the anchoring area 301c of the membrane. These square holes are for example diametrically opposite relative to the central part 301a of the membrane.

The structure provided for application of the mechanical stress can also fulfil a mechanical centring function of the optical device relative to the optical block. In this perspective, the embodiments of FIGS. 10A, 10C and 10D, which control this centring, are particularly advantageous.

There are many other possible forms of structures. These structures can be formed over the entire thickness of the substrate 302b as shown in FIGS. 9A-9B to release another element constituting the optical device (for example the membrane as illustrated in this example) or only over part of the thickness (for example in the form of a hole or a groove whereof the depth is less than the thickness of the substrate, embodiment not illustrated).

Another embodiment consists of creating a protuberance 3022 on the surface of the substrate 302b to facilitate stressing of this region during the later focusing function (cf. FIG. 11). Such a solution can prevent integration of additional structures at the level of the optical block to apply stress.

All the examples detailed hereinbelow can also apply to the substrate 302a and/or the adhesive bead 302c.

In all cases, the region or the regions of the optical device to which the mechanical stress is applied must be able to displace fluid towards the central area of the cavity (or inversely) so there can be an effect on the optical power at rest of the optical device.

In the examples described hereinabove, fluid is present over the entire surface of the optical device. It is also possible to minimise the amount of fluid by limiting it to the central area of the membrane and to the actuation area. In this case, as illustrated in FIGS. 12A-12B, channels 303c can be provided between a central cavity 303a of the optical device and a peripheral cavity 303b on contact by the anchoring area 301c with the membrane, intended to be stressed to adjust the initial optical power. In this way, mechanical stress applied to a part of the anchoring area 301c has the effect of pushing some of the fluid contained in the peripheral cavity 303b towards the central cavity 303a via a channel 303b.

The structure or structures intended to be integrated into the optical block can be varied and depend considerably on the solutions used for assembling the fixed optical block in the camera, any structures provided on the optical device and solutions which will be selected for applying stress to the optical device.

The optical block in the camera is assembled according to classic techniques of the prior art.

Contrary to known autofocus cameras, no displacement of the optical block is required once the latter is assembled in the camera. Consequently, it is no longer indispensable to provide the barrel with a thread and the mount with an inner thread.

There are two main methods for assembling the camera.

Figure 13A:
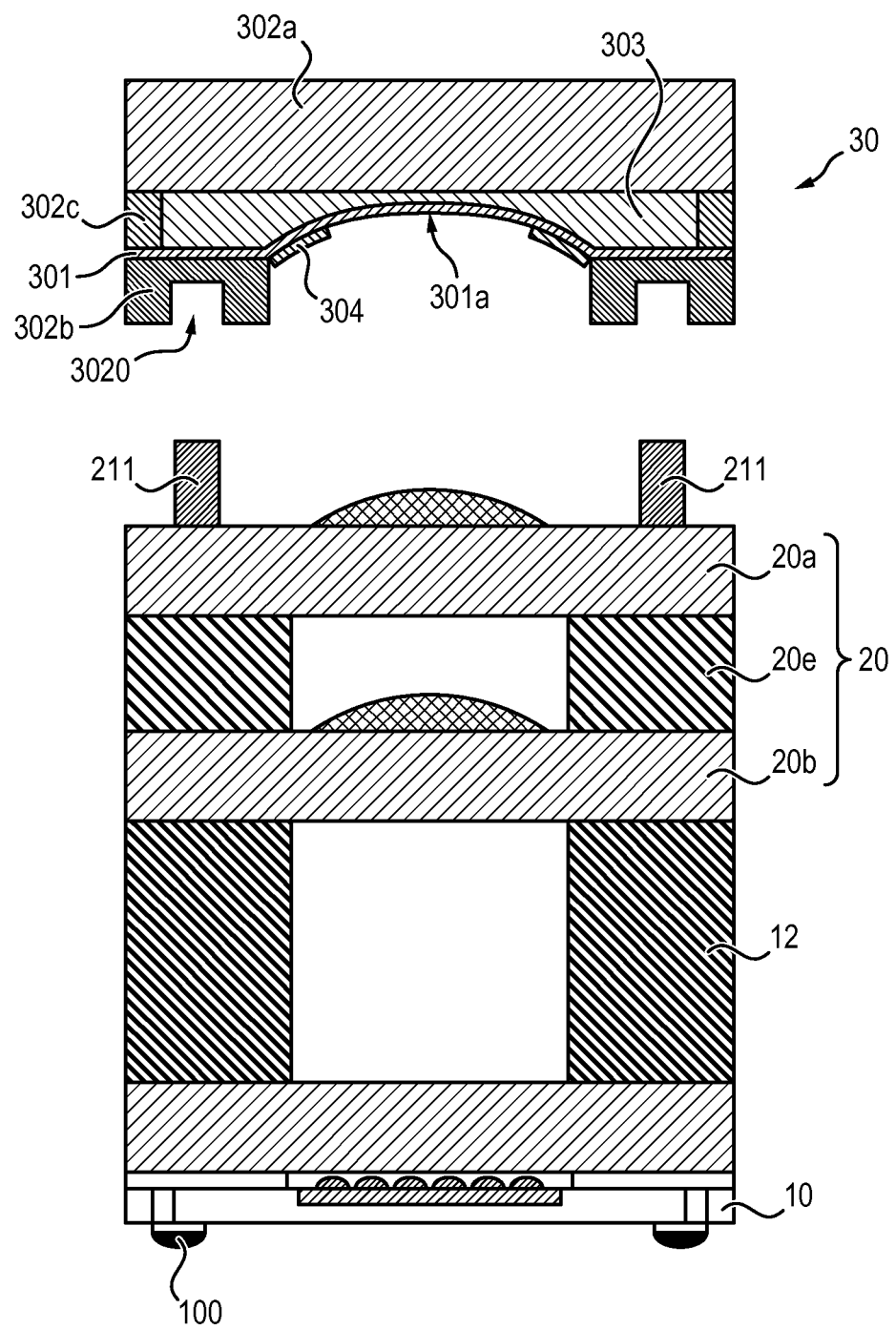
FIG. 13A is a sectional view of a camera according to an embodiment, before its assembly ("waferlevel" assembly)
Figure 14B:
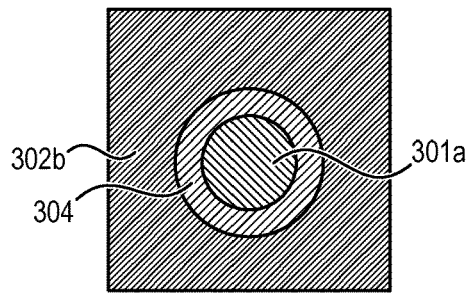
FIGS. 14B and 14C are respectively a bottom plan view of the optical device and a plan view of the optical block of said camera.
Figure 14C:
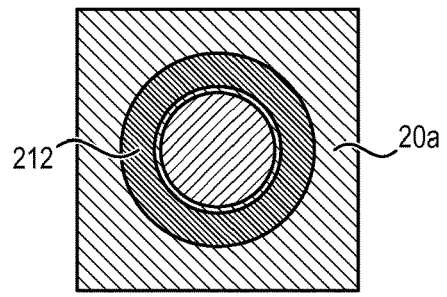

In a first process so-called "waferlevel", the optical block is stacked directly on the image sensor. An example of such assembly is illustrated in FIG. 13A, the optical block comprising in this case two lenses 20*a*, 20*b* separated by a spacer 20*e*. In this case, the image sensor 10 is often stuck to a substrate for example glass and its interconnections 100 are attached to its rear face by a technique known under the name of TSV ("Through Silicon Vias"). A spacer 12 is used in this case to position the optical block 20 at an adequate distance from the image sensor 10, that is, the focal distance of the optical block.

According to a second process, so-called traditional method, the lenses forming the optical block can be assembled directly in the mount.

In the case of a waferlevel assembly technique as illustrated in FIG. 13A, it is advantageous, even if non-essential, to place the optical device with the silicon substrate 302*b* towards the image sensor. The glass substrate 302*a* of the optical device with variable focal length 30 acts as protection for the components of the camera. The membrane 301, which is more fragile, is protected from external aggressions. The region of the device stressed mechanically is therefore advantageously the silicon substrate 302*b*.

A solution of a simple structure for exerting permanent mechanical stress on the optical device with variable focal length 30 consists of providing studs 211 on the optical block (for example on the upper surface of the last lens to which the optical device with variable focal length is attached), and ideally placing them facing structures provided especially to vary the optical power at rest of the optical device with variable focal length (specifically a groove 3020 arranged in the substrate 302*b* in the case illustrated in FIG. 13A, or two oblong holes 3021 in the case illustrated in FIG. 13B). Therefore, during the later focusing step, more or less strong pressure exerted on the optical device with variable focal length will modify its optical power at rest.

Said studs can be added unitary elements, such as spheres or unitary pieces. They can be formed on the surface of the optical block (as illustrated in FIG. 13A) or of the optical device with variable focal length itself by any appropriate technique such as, for example, serigraphy, dispensing, stamping, thermoforming, moulding, etc. The studs can be made of metallic materials (for example Cu, Al, alloys of Pb, alloys of Sn/Cu, Ni . . . ), ceramics (for example AlN, $Al_2O_3$ . . . ) or organic (such as adhesives, films, resins).

The thermal dilation coefficients of materials used can be selected such that once focusing is completed, the structures compensate any temperature drift of the optical power at rest of the optical device with variable focal length and/or of the optical block.

Such studs arranged on the optical block can also be suitable if no particular additional structure is provided on the optical device with variable focal length.

But, in the advantageous case of FIG. 13A where respective complementary structures 3020, 211 on the optical device with variable focal length 30 and on the optical block 30 are provided, said structures can, over and above their role of mechanical stress of the optical device with variable focal length, play a role of auto-alignment of the optical device with variable focal length on the optical block. Because centring of the optical device with variable focal length can be critical, such an approach can prove particularly significant.

An alternative solution consists of placing a structure on the optical block facing a particular geometrical feature of the optical device with variable focal length. In the embodiment illustrated in FIG. 14A, no particular structure is required on the optical device with variable focal length 30. The opening created in the silicon substrate 302*b* for releasing the central part 301*a* of the membrane and the actuation device 304 is used. Facing the periphery of this opening, a protuberant crown 212 having an inclined flap is integrated on the optical block 20. The angle of the inclined flap of the crown 212, which cooperates with the above opening in the substrate 302*b*, participates in auto-centring of the optical device with variable focal length 30 on the optical block 20. It is also advantageous to avoid any pivoting of the optical device with variable focal length relative to the optical block during assembly and ensure parallel alignment of these two elements.

Figure 15:
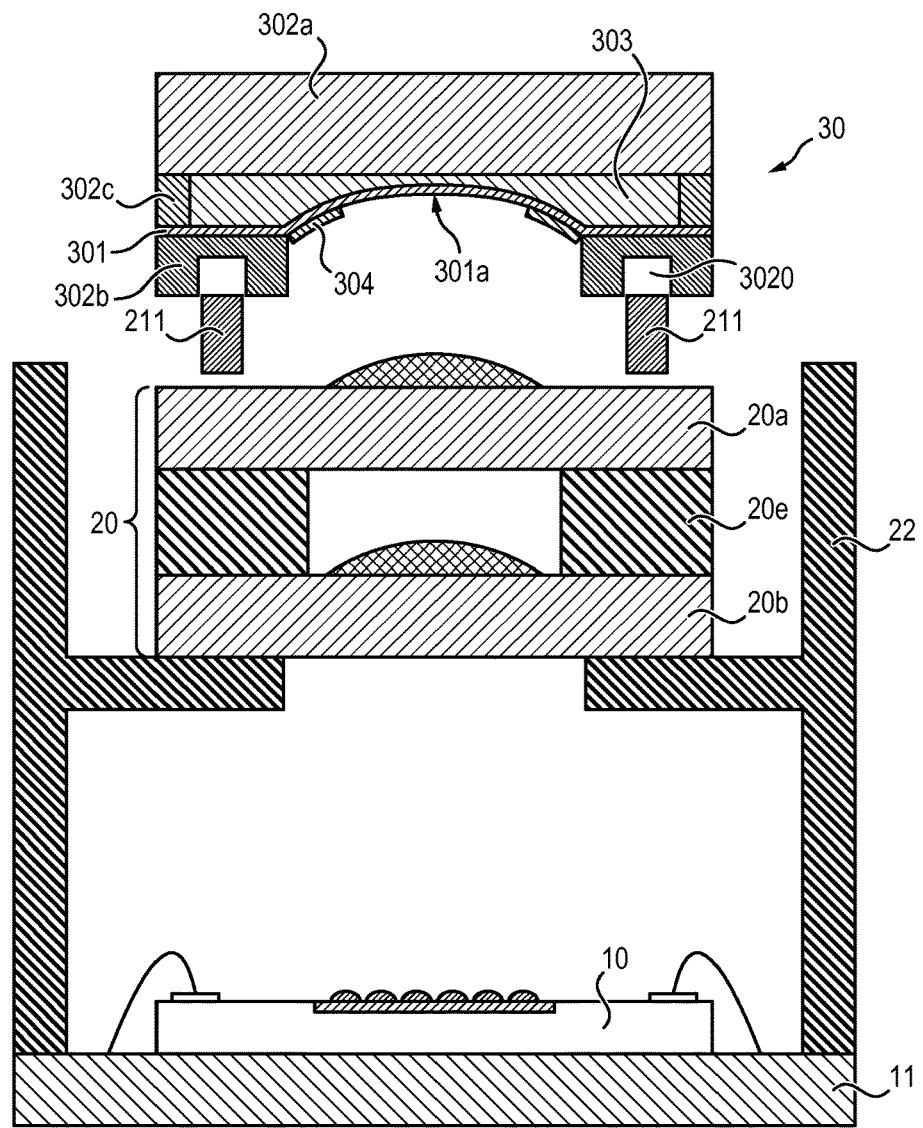
FIG. 15 is a sectional view of a camera according to an embodiment, before its assembly (traditional assembly)
Figure 16:
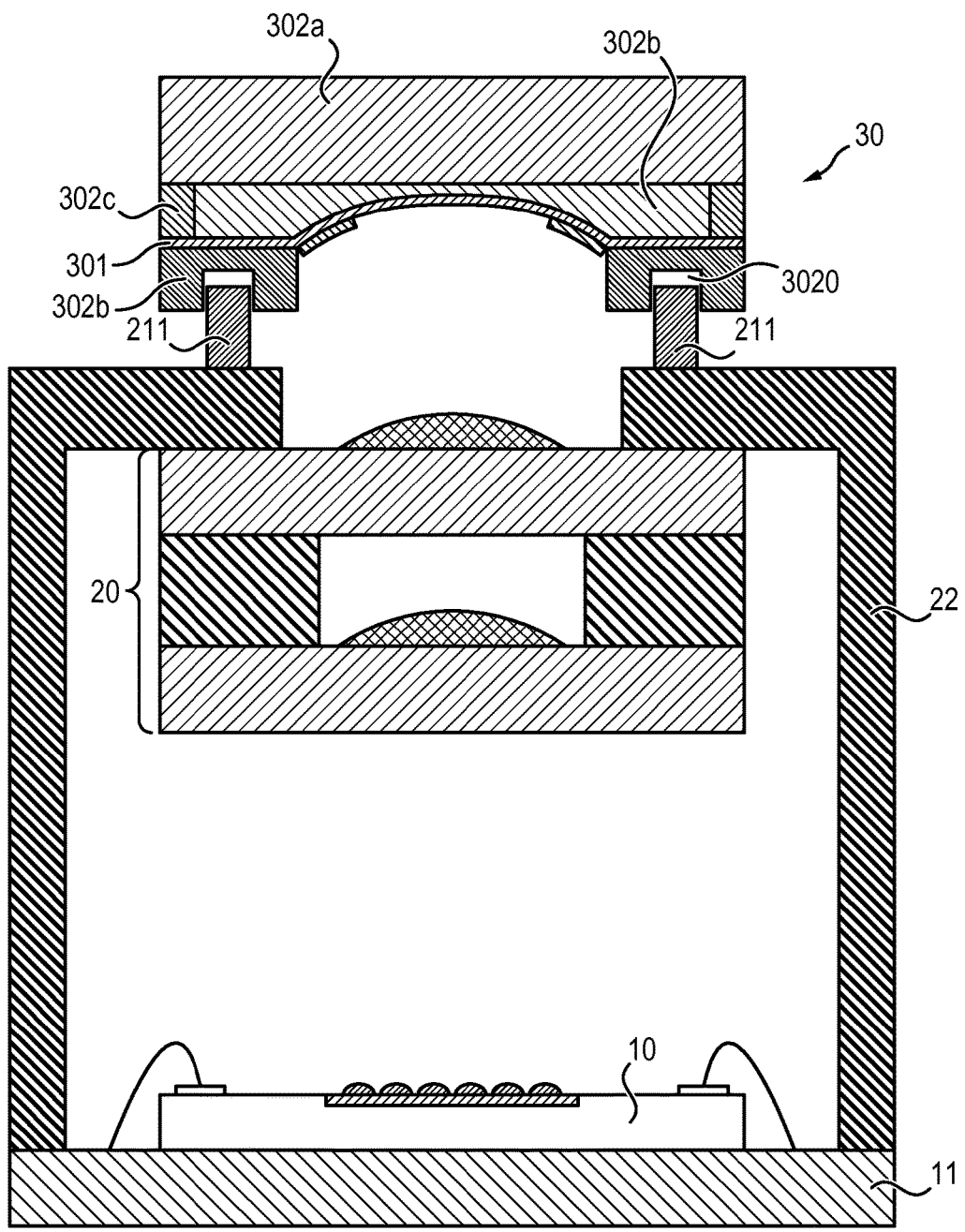
FIG. 16 is a sectional view of a camera according to an embodiment, before its assembly (traditional assembly)

The solutions presented hereinabove for a waferlevel assembly technique can also be used in the case of traditional assembly of the optical block in a mount, as illustrated in FIGS. 15 and 16.

According to these techniques of traditional assembly, the mount 22 can play an additional role and comprise stress structures. In the example of FIG. 16, the optical device with variable focal length 30 is assembled on the optical block 20 by means of the mount 22, said mount bearing studs 211 cooperating with the annular groove 3020 to exert mechanical stress on the optical device with variable focal length 30. In the case of FIG. 15, the optical device with variable focal length 30 is assembled directly on the optical block 20 which is itself fixed on the mount 22. Stress studs 211 of an annular groove 3020 of the optical device with variable focal length are arranged on the optical block 20.

The focusing of the camera is necessary for objects located at infinity and captured by the camera to be clear.

During this operation, acquisition of images of an object (most often a sight) placed at infinity or at least at a sufficiently large distance from the camera is carried out. In the present invention and differing from known techniques, the optical block is not moved. Also, stress is exerted on the optical device with variable focal length. During this operation, the mechanical stress applied to the optical device with variable focal length is varied with the aim of varying its optical power at rest) and several acquisitions of images are completed. Analysis of these images (often the modulation transfer function (MTF)) determines the mechanical stress corresponding to infinite maximal sharpness.

There are different ways of applying this stress to the optical device with variable focal length.

According to an embodiment of the invention, this focusing function is carried out simultaneously with the assembly operation of the optical device with variable focal length in the camera. For assembly by adhesion such as illustrated in FIG. 17A, adhesive 213 can be dispensed or screened onto the optical device with variable focal length or on the optical block 20, advantageously at the level of the structures 211 provided to stress the optical device with variable focal length.

During contacting of the optical device with variable focal length 30 on the optical block 20, the force exerted to squash the adhesive 213 is progressively increased.

Simultaneously conducting image analysis can determine the optimal stress corresponding to the maximum sharpness of the image. At this instant, before this stress is relaxed, the adhesive 213 is polymerised to keep the optical device with variable focal length 30 in this state of deformation, which therefore becomes permanent. In this way, the focusing of the camera has been executed by adjusting the power at rest of the optical device with variable focal length, as illustrated in FIG. 17B.

In the example hereinabove, the adhesive and the studs can form the same material only using some UV adhesives which also polymerise thermally. The adhesive can be dispensed or spread on to form the studs, expose them to UV (which would have the effect of curing the adhesive and forming wedges), position the optical device with variable focal length by adjusting the pressure and finishing adhesion by polymerising the adhesive thermally.

Another solution for applying this stress to the optical device with variable focal length during the focusing function consists of keeping a thread/inner thread system in the optical block. In this case, illustrated in FIGS. 18A and 18B, this system is no longer intended to move the barrel but exert more or less considerable stress on the optical device with variable focal length 30. An inner thread 220 is formed in the mount 22. A supplementary hood 23 containing a thread 230 complementary with the inner thread 220 is used. The optical device with variable focal length 30 is placed in the hood 23. The hood 23 is progressively screwed into the mount 22 and stress is progressively applied to the optical device with variable focal length 30 by means of the studs 211 provided on the optical block 20. Once the position producing maximal sharpness is determined by analysis of the images acquired, the hood 23 is held en position on the mount 22 for example by adhesion or even by local fusion 231 (cf. FIG. 17B). Such a focusing approach has the advantage of being able to use equipment traditionally used for this operation. In fact, viewed from the exterior, the structure of the camera (hood/mount) is still close to the classic structure (barrel/mount).

This approach based on thread/inner thread can also be applied to a waferlevel configuration. For example, an inner thread is formed in a piece intended to apply stress to the optical device with variable focal length. This piece is deposited onto or assembled on the last lens of the camera. A hood containing the optical device with variable focal length is then assembled on this piece. Focusing is ensured by more or less screwing the hood into the tapped piece.

This solution is particularly attractive for "low-resolution" cameras. In fact, the dimensions of the camera and its manufacturing on a wafer scale are not affected by this focusing solution. The advantages relative to this manufacturing technique are therefore preserved along with benefiting from traditionally used focusing means.

In the figures presented so far, the electrical connection of the device with variable focal length was not shown for simplification reasons.

The following description addresses this subject. The focusing such as executed in the invention can also participate in electrical connection of the optical device with variable focal length. In fact, the stress exerted for varying the optical power at rest of the optical device with variable focal length can also participate in executing its interconnection with the image sensor or the substrate. Inversely, the interconnection solution can participate in stress of the optical device with variable focal length.

For simplification reasons of drawings FIG. 19 illustrates an optical device with variable focal length comprising connection studs 305 located on the periphery of the device (there are many other possible positions for these connection studs). There are two of these studs and they are positioned in the case of FIG. 19 beyond the adhesive bead 302c. This is also an example of many others. The optical device with variable focal length can optionally have more interconnecting studs (these studs can be located at any level of the technological stack).

In the prior art, there are several ways of electrically connecting a device with variable focal length located in a camera.

A first approach consists of inserting the interconnections 206 into the optical block 20, as illustrated in FIGS. 20A (waferlevel assembly) and 20B (traditional assembly). Examples of known solutions are solutions based on conductive adhesives (vias are made in the camera and are filled with conductive materials such as adhesives loaded with silver or inks loaded with copper, for example). Rigid elements such as metal springs of "Pogo™ pin" type or metallic rods can also be used.

The resulting interconnections connect the device with variable focal length to the image sensor or the substrate of the camera which itself is connected towards the exterior (motherboard of the mobile telephone for example). It is by means of these interconnections that electrical actuation voltage can be applied to the device with variable focal length.

Figure 21:
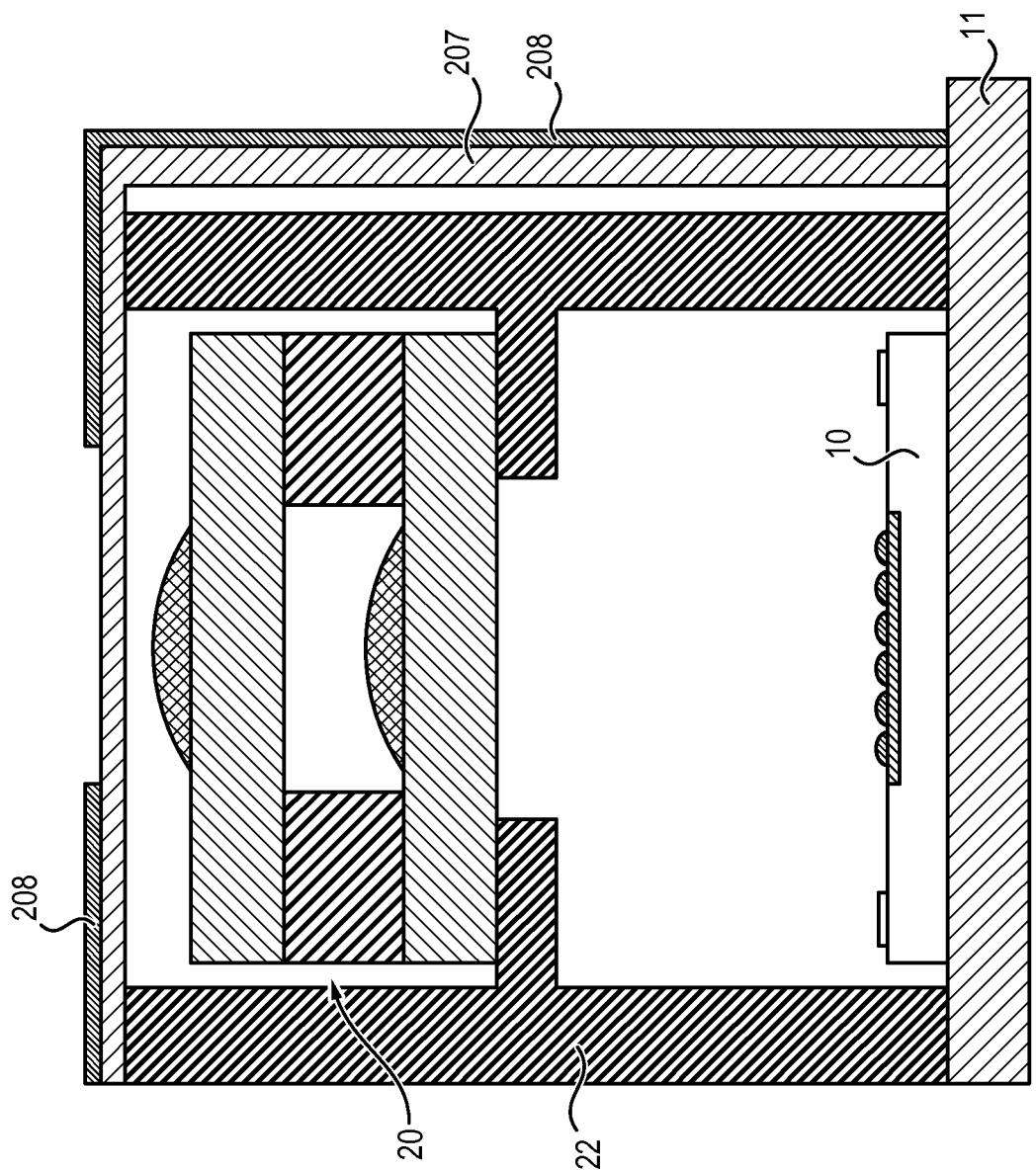
FIG. 21 is a sectional view of the optical block and two interconnections arranged outside said block.

A second approach consists of taking the interconnections out of the optical block, as illustrated for example in FIG. 21. In this case, an additional substrate 207 (advantageously flexible of FPC type ("Flexible Printed Circuit") is provided to which the device with variable focal length is attached (not shown in this figure). The interconnections are in this case conductive tracks 208 (classically copper for an FPC made of polyester or polyimide, for example) traced on the substrate 207. This substrate is then placed along the mount 22 to minimise the dimensions of the camera then connected to the substrate 11 of the camera by way of conventional techniques (connector adapted, local welding, . . . ).

FIGS. 22A and 22B refer to a waferlevel assembly. The two electrical interconnections 206 made in the optical block of the camera are duplicated to form two stress structures 211 of the optical device with variable focal length. These two extra structures 211 do not fulfil any electrical function but only a mechanical stress function.

According to such an approach, it is necessary to ensure electrical connection of the optical MEMS over the whole range of stresses intended to vary the initial optical power of the MEMS.

Figure 23:
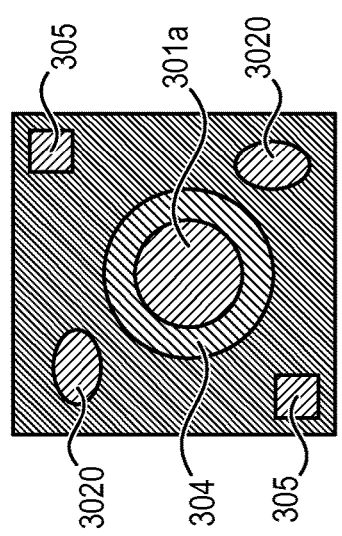
FIG. 23 is a plan view of an optical device comprising two interconnecting studs and two structures in the substrate to facilitate application of permanent stress.

It is advantageous to place the stress structures and the electrical contact studs in the corner(s) of the optical device with variable focal length. In fact, the often circular geometry of lenses and the rectangular or square shape of optical devices with variable focal length, which is due to waferlevel manufacturing and cutting, cause areas not useful from an optical viewpoint in the corners. These areas are therefore used to integrate these elements and minimise impact on the dimensions of the optical device with variable focal length and therefore of the camera (cf. FIG. 23).

Figure 24A:
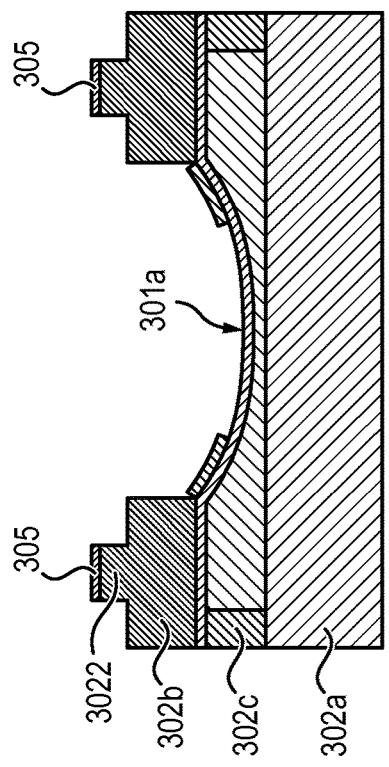
FIGS. 24A to 24C are sectional views of embodiments of the optical device with different arrangements of interconnecting studs at the level of the areas of mechanical stress.
Figure 24C:
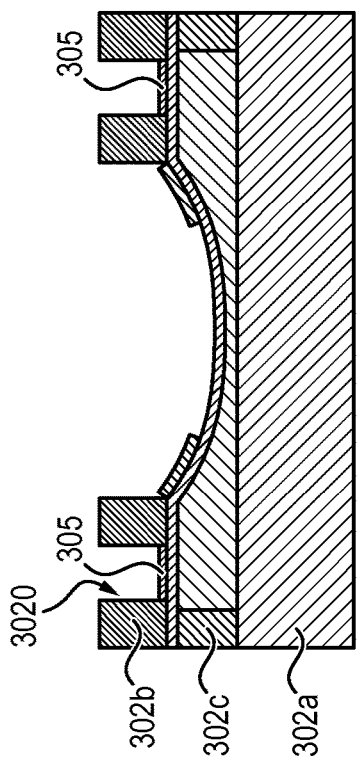
Figure 24B:
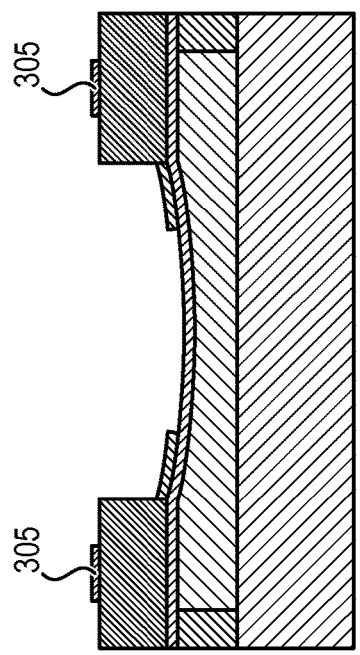

Careful placing of the contact studs on the optical device with variable focal length makes it possible to direct the role of stress structure to the electrical interconnections. In fact, placing the electrical contact studs in the region of the optical device with variable focal length sensitive to stress enables simultaneously executing the interelectrical connection and the mechanical stress of the optical device with variable focal length (cf. FIGS. 24A-24C).

Structuring the electrical contact stud of the optical device with variable focal length (by increasing its thickness, for example) or adding a structure participating in interconnection such as a stud bump for example (made of conductive polymer or metal such as gold), the stud and the stress structure can then form only one and the same element.

Figure 25:
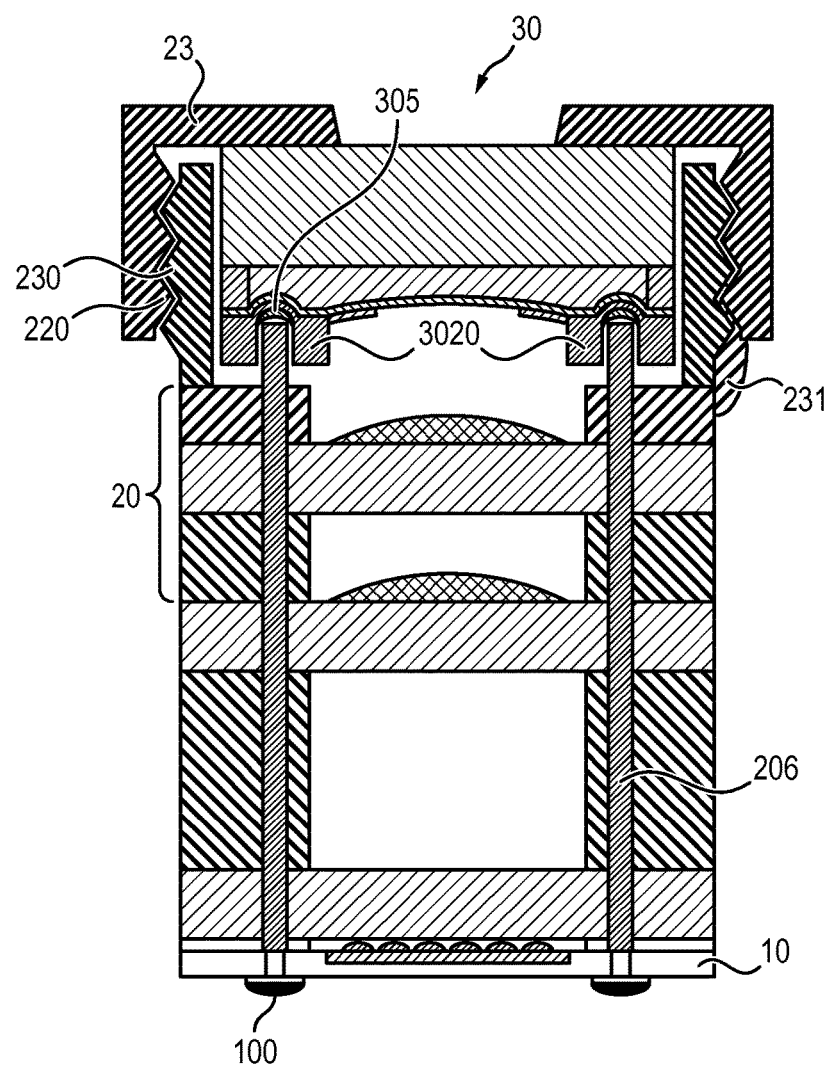
FIG. 25 is a sectional view of an assembled camera ("waferlevel" assembly)

By combining the functions (electrical connection and mechanical stress), the number of structures can be optimised and the dimensions of the camera reduced. FIG. 25 illustrates an example of assembly executing a thread/inner thread system such as described above. In the substrate 302b, the optical device with variable focal length has a groove 3020 for application of permanent mechanical stress. Two interconnecting studs 305 are arranged at the base of this groove 3020. Two interconnection structures 206 extend through the optical block and at the same time ensure electrical contact with the interconnecting studs 305 and mechanically stress the optical device with variable focal length.

The examples illustrated in FIGS. 22B and 25 corresponding to waferlevel assembly technique can also apply by analogy to a traditional assembly technique, as illustrated respectively in FIGS. 26 and 27. The interconnection and/or stress structures can optionally pass through the mount and/or all the lenses (in the non-optical area).

Figure 28A:
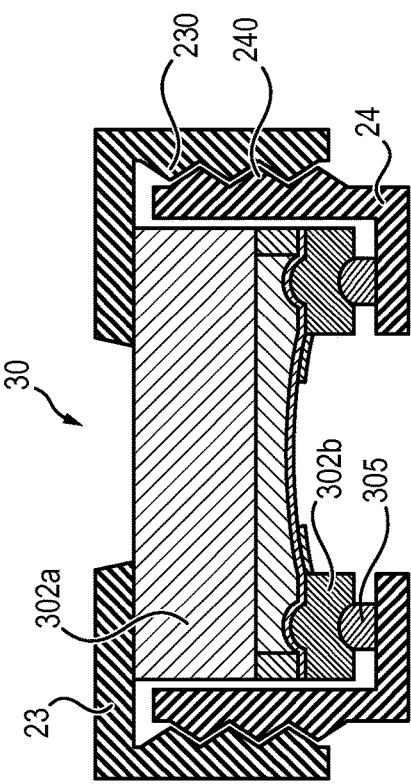
FIGS. 28A, 28B, 28C are respectively a sectional view of a threaded ensemble, a plan view of the hood and a bottom plan view of the counter-piece.
Figure 28C:
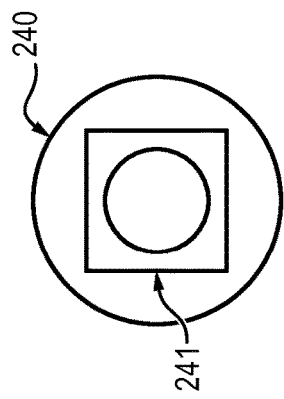
Figure 28B:
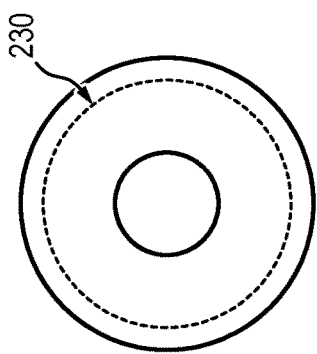

The thread/inner thread system used to exert stress on the optical device with variable focal length must be compatible with requirements associated with interconnection of the optical device with variable focal length. Most of the time, as the electrical contacts on the substrate or the image sensor are positioned in a precise location, the contacts of the optical device with variable focal length must be at a determined location, facing the interconnection provided. It may in this case be necessary to prevent any rotation of the optical device with variable focal length and to apply translation movement only. FIGS. 28A-28O illustrate such an embodiment. The optical device with variable focal length 30 is received in a notch 241 of as piece 24 having a thread 240 cooperating with an inner thread 230 of the hood 23. The shape of the notch 241 is complementary to that of the optical device with variable focal length 30—which has no revolution symmetry—and therefore prevents any rotation of the optical device with variable focal length when the hood 23 is screwed onto the piece 24. The interconnecting studs 305 of the optical device with variable focal length are arranged on the substrate 302b facing the anchoring area of the membrane. When the hood 23 is screwed onto the piece 24, the optical device with variable focal length is compressed, causing mechanical stress on the interconnecting studs 305 on the substrate 302b.

Finally, FIGS. 29A and 29B illustrate a traditional assembly mode in which the electrical connections of the optical device with variable focal length are arranged outside the optical block. In this example, stud bumps 305 are placed on the optical device with variable focal length before assembly. These stud bumps here play a role in the electrical connections of the optical device with variable focal length but also in the adjustment of its initial optical power. The stud bumps are positioned in this example on the optical device with variable focal length but they could just as well be positioned on the additional substrate 207 facing the contact studs of the optical device with variable focal length.

Naturally, there is a wide diversity of embodiments possible and the invention is not limited to the particular examples illustrated.

The invention claimed is:

1. An autofocus camera comprising:
    an image sensor,
    an optical block comprising a plurality of lenses with fixed focal length,
    an optical device with variable focal length comprising:
        a deformable membrane,
        a support to which a peripheral anchoring area of said membrane is connected,
        a cavity filled with a constant volume of fluid, said cavity being delimited at least in part by said membrane and a support wall, and
        an actuation device of a region of the membrane located between the peripheral anchoring area and a central part of the membrane, configured to bend by application of electrical actuation voltage so as to displace some of the fluid volume towards the centre or towards the periphery of the cavity,
    wherein at least one region of the optical device, distinct from the central part and the actuation region of the membrane, is mechanically and permanently deformed by a component of the autofocus camera such that the at least one region protrudes into a volume of the cavity so as to cause a deformation of the central part of the membrane by displacement of the fluid, wherein when the actuation device is at rest, the focal distance of the optical device under the effect of said displacement of the fluid is different from the focal distance of said optical device without the displacement of the fluid.

2. The autofocus camera according to claim 1, wherein the at least one region protrudes into a volume of the cavity substantially between the periphery of the cavity and a fluid volume opposite the actuation region of the membrane.

3. The autofocus camera according to claim 1, wherein the support comprises a first substrate defining the base of the cavity and a second substrate attached to the anchoring area of the membrane, the first substrate and the second substrate being connected by an adhesive bead defining a circumferential wall of the cavity.

4. The autofocus camera according to claim 3, wherein the at least one region is located at the second substrate.

5. The autofocus camera according to claim 3, wherein the at least one region is a locally thinner region of the second substrate.

6. The autofocus camera according to claim 3, wherein the at least one region is a region of the second substrate which causes the anchoring area of the membrane to deform.

7. The autofocus camera according to claim 3, wherein the at least one region is a locally thicker region of the second substrate.

8. The autofocus camera according to claim 3, wherein the at least one region is located at the adhesive bead.

9. The autofocus camera according to claim 3, wherein the at least one region is located at the first substrate.

10. The autofocus camera according to claim 1, wherein the cavity containing the fluid is divided between a central cavity facing the central part of the membrane and a peripheral cavity in fluid connection with the central cavity by at least one channel, and the at least one region is facing said peripheral cavity.

11. The autofocus camera according to claim 1, wherein the at least one region is permanently and mechanically deformed by at least one protrusion extending from the optical block towards the at least one region of the device with variable focal length.

12. The autofocus camera according to claim 1, further comprising interconnecting studs providing electrical connection between the image sensor and respective electrical contacts of the optical device with variable focal length arranged in the at least one region, the at least one region being deformed by said interconnecting studs.

13. The autofocus camera according to claim 1, wherein the image sensor, the optical block and the optical device with variable focal length are each integrated with a substrate to form a stack.

14. The autofocus camera according claim 1, wherein the optical block and the optical device with variable focal length are arranged on a mount attached to the image sensor.

15. The autofocus camera according to claim 1, wherein thermal dilation coefficients of an application means configured to deform the at least one region are selected so as to compensate a temperature drift of the optical power at rest of at least one of: the optical device with variable focal length, or the optical block.

16. An optical device with variable focal length, the optical device comprising:
- a deformable membrane,
- a support to which a peripheral anchoring area of said membrane is connected,
- a cavity filled with a constant volume of fluid, said cavity being delimited at least in part by said membrane and a support wall, and
- an actuation device of a region of the membrane located between the peripheral anchoring area and a central part of the membrane, configured to bend by application of electrical actuation voltage so as to displace some of the fluid volume towards the centre or towards the periphery of the cavity,
- wherein at least one region of the optical device, distinct from the central part and the actuation region of the membrane, is mechanically and permanently deformed by a component of an autofocus camera such that the at least one region protrudes into a volume of the cavity so as to cause a deformation of the membrane by displacement of the fluid, wherein when the actuation device is at rest, the focal distance of the optical device under the effect of said displacement of the fluid is different from the focal distance of said optical device without the displacement of the fluid.

17. The optical device according to claim 16, wherein the support comprises a first substrate defining the base of the cavity and a second substrate attached to the anchoring area of the membrane, the first substrate and the second substrate being connected by an adhesive bead defining a circumferential wall of the cavity.

18. The optical device according to claim 17, wherein the at least one region locally protrudes into a volume of the cavity substantially between the periphery of the cavity and a fluid volume opposite the actuation region of the membrane.

19. A method of manufacturing an autofocus camera, the method comprising:
- assembling an optical block on an image sensor, wherein the optical block comprises a plurality of lenses with fixed focal length, and
- assembling an optical device with variable focal length on the whole formed by the optical block and the image sensor, wherein:
  - the optical device comprises:
    - a deformable membrane,
    - a support to which a peripheral anchoring area of said membrane is connected,
    - a cavity filled with a constant volume of fluid, said cavity being delimited at least in part by said membrane and a support wall, and
    - an actuation device of a region of the membrane located between the peripheral anchoring area and a central part of the membrane, configured to bend by application of electrical actuation voltage so as to displace some of the fluid volume towards the centre or towards the periphery of the cavity, and
  - the assembling the optical device on the whole comprises applying mechanical stress on a region of said optical device separate from the central part and of the actuation region of the membrane, such that the region protrudes into a volume of the cavity, the effect of said mechanical stress being displacing some of the fluid volume and deforming the central part of the membrane so as to vary the focal distance of the optical device when the actuation device is at rest.

20. The method according to claim 19, further comprising:
- analyzing images acquired by the autofocus camera to determine mechanical stress that focuses the autofocus camera.

* * * * *